US010784901B2

(12) United States Patent
Kudekar et al.

(10) Patent No.: US 10,784,901 B2
(45) Date of Patent: Sep. 22, 2020

(54) PUNCTURING FOR STRUCTURED LOW DENSITY PARITY CHECK (LDPC) CODES

(71) Applicant: QUALCOMM Incorporated, San Diego, CA (US)

(72) Inventors: Shrinivas Kudekar, Raritan, NJ (US); Se Yong Park, San Diego, CA (US); Alexandros Manolakos, San Diego, CA (US); Krishna Kiran Mukkavilli, San Diego, CA (US); Vincent Loncke, Piscataway, NJ (US); Joseph Binamira Soriaga, San Diego, CA (US); Jing Jiang, San Diego, CA (US); Thomas Joseph Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/202,207

(22) Filed: Jul. 5, 2016

(65) Prior Publication Data

US 2017/0141798 A1 May 18, 2017

Related U.S. Application Data

(60) Provisional application No. 62/254,678, filed on Nov. 12, 2015.

(51) Int. Cl.
*H03M 13/00* (2006.01)
*H04L 1/00* (2006.01)
(Continued)

(52) U.S. Cl.
CPC ....... *H03M 13/6527* (2013.01); *H03M 13/03* (2013.01); *H03M 13/036* (2013.01);
(Continued)

(58) Field of Classification Search
CPC ......... H03M 13/6527; H03M 13/6362; H03M 13/036; H03M 13/116; H04L 1/0041;
(Continued)

(56) References Cited

U.S. PATENT DOCUMENTS 5,583,500 A 12/1996 Allen et al.
5,844,918 A 12/1998 Kato
(Continued)

FOREIGN PATENT DOCUMENTS

CN 101188428 A 5/2008
CN 101682381 A 3/2010
(Continued)

OTHER PUBLICATIONS

International Search Report and Written Opinion—PCT/US2016/048178—ISA/EPO—dated Nov. 3, 2016.
(Continued)

*Primary Examiner* — Thien Nguyen
(74) *Attorney, Agent, or Firm* — Qualcomm IP Dept.; James Hunt Yancey, Jr.

(57) ABSTRACT

Certain aspects of the present disclosure generally relate to techniques for puncturing of structured low density parity check (LDPC) codes. A method for wireless communications by wireless node is provided. The method generally includes encoding a set of information bits based on a LDPC code to produce a code word, the LDPC code defined by a matrix having a first number of variable nodes and a second number of check nodes, puncturing the code word to produce a punctured code word, wherein the puncturing is performed according to a first puncturing pattern designed to puncture bits corresponding to one or more of the variable nodes having a certain degree of connectivity to the check nodes, and transmitting the punctured code word.

33 Claims, 14 Drawing Sheets

100
136
130
132
134
112
110
118
108
106
114
104
116
120
126
122
124
102
146
138
140
144
142
136
IoE Device
IoE Device

(51) Int. Cl.
*H03M 13/03* (2006.01)
*H03M 13/11* (2006.01)
*H04L 1/18* (2006.01)

(52) U.S. Cl.
CPC ...... *H03M 13/1102* (2013.01); *H03M 13/116* (2013.01); *H03M 13/1137* (2013.01); *H03M 13/6362* (2013.01); *H04L 1/0041* (2013.01); *H04L 1/0045* (2013.01); *H04L 1/0057* (2013.01); *H04L 1/0069* (2013.01); *H04L 1/1819* (2013.01)

(58) Field of Classification Search
CPC ... H04L 1/0057; H04L 1/0045; H04L 1/1819; H04L 1/0069
See application file for complete search history.

(56) References Cited

U.S. PATENT DOCUMENTS 6,633,865 B1 10/2003 Liao
6,854,082 B1 2/2005 Rhee
6,931,581 B1 8/2005 Cassiday et al.
6,961,888 B2 11/2005 Jin et al.
7,133,853 B2 11/2006 Richardson et al.
7,222,284 B2 5/2007 Stolpman
7,493,551 B2 2/2009 Berens et al.
7,526,717 B2 4/2009 Kyung et al.
7,552,097 B2 6/2009 Richardson et al.
7,571,372 B1 8/2009 Burd et al.
7,627,801 B2 12/2009 Jin et al.
7,793,194 B2 9/2010 Seo et al.
7,840,880 B1 11/2010 Bain
7,979,784 B2 7/2011 Shao et al.
7,986,622 B2 7/2011 Frazier et al.
8,006,162 B2 8/2011 Choi et al.
8,117,516 B2 2/2012 Kim et al.
8,132,072 B2 3/2012 El-Khamy et al.
8,151,157 B2 4/2012 Lee et al.
8,271,846 B2 9/2012 Myung et al.
8,418,015 B2 4/2013 Cao et al.
8,453,030 B2 5/2013 Richardson et al.
8,484,545 B2 7/2013 McLaughlin et al.
8,516,334 B2 8/2013 Xu et al.
8,687,751 B1 4/2014 Lee et al.
8,751,902 B2 6/2014 Jin et al.
9,362,956 B2 6/2016 Mahdavifar et al.
9,479,375 B1 10/2016 Ankarali et al.
9,667,381 B2 5/2017 Jeong et al.
9,692,451 B2 6/2017 Vasista et al.
9,917,675 B2 3/2018 Kudekar et al.
10,291,354 B2 5/2019 Richardson et al.
10,291,359 B2 5/2019 Xu et al.
10,312,939 B2 6/2019 Richardson et al.
10,313,057 B2 6/2019 Lin et al.
10,348,451 B2 7/2019 Kudekar et al.
10,355,822 B2 7/2019 Patel et al.
10,454,499 B2 10/2019 Richardson et al.
10,469,104 B2 11/2019 Kudekar et al.
2002/0147954 A1 10/2002 Shea
2003/0033575 A1 2/2003 Richardson et al.
2003/0053435 A1 3/2003 Sindhushayana et al.
2003/0123409 A1 7/2003 Kwak et al.
2004/0187129 A1 9/2004 Richardson
2005/0078765 A1 4/2005 Jeong et al.
2005/0149842 A1 7/2005 Kyung et al.
2005/0283707 A1 12/2005 Sharon et al.
2005/0283708 A1 12/2005 Kyung et al.
2006/0020868 A1 1/2006 Richardson et al.
2006/0020872 A1 1/2006 Richardson et al.
2006/0156199 A1 7/2006 Palanki et al.
2006/0184855 A1 8/2006 Wang et al.
2007/0011567 A1 1/2007 Choi et al.
2007/0113147 A1 5/2007 Hong et al.
2007/0113148 A1 5/2007 Hong et al.
2007/0162815 A1* 7/2007 El-Khamy .......... H03M 13/033 714/752
2008/0178065 A1 7/2008 Khandekar et al.
2008/0207120 A1* 8/2008 Kurina .................. H04W 28/06 455/39
2008/0320353 A1 12/2008 Blankenship et al.
2009/0158129 A1 6/2009 Myung et al.
2009/0204868 A1 8/2009 Park et al.
2009/0217129 A1* 8/2009 Myung .............. H03M 13/1102 714/752
2009/0259915 A1 10/2009 Livshitz et al.
2009/0300461 A1 12/2009 Shor et al.
2010/0077275 A1 3/2010 Yu et al.
2010/0107033 A1* 4/2010 Kuri ................... H03M 13/1102 714/752
2010/0185926 A1 7/2010 Lawson et al.
2010/0199153 A1 8/2010 Okamura et al.
2010/0211844 A1 8/2010 Yuda et al.
2010/0257425 A1 10/2010 Yue et al.
2010/0275089 A1 10/2010 Mow et al.
2010/0325511 A1 12/2010 Oh et al.
2011/0047433 A1 2/2011 Abu-Surra et al.
2011/0066916 A1 3/2011 Abu-Surra et al.
2011/0096862 A1 4/2011 Kuri et al.
2011/0126072 A1 5/2011 Yoshimoto et al.
2011/0161772 A1 6/2011 Yoshii et al.
2012/0084625 A1 4/2012 Pisek et al.
2012/0166917 A1 6/2012 El-Khamy et al.
2012/0240001 A1 9/2012 Abu-Surra et al.
2012/0317461 A1 12/2012 Hwang et al.
2013/0117344 A1 5/2013 Gross et al.
2013/0272378 A1 10/2013 Sole Rojals et al.
2014/0003533 A1 1/2014 He et al.
2014/0019820 A1 1/2014 Vardy et al.
2014/0040214 A1 2/2014 Ma et al.
2014/0201592 A1 7/2014 Shen et al.
2014/0229788 A1* 8/2014 Richardson ......... H03M 13/036 714/752
2014/0229789 A1 8/2014 Richardson
2014/0304574 A1 10/2014 Seo et al.
2014/0365842 A1 12/2014 Li et al.
2014/0365845 A1 12/2014 Pantelias et al.
2015/0120798 A1 4/2015 Jeong et al.
2015/0188666 A1 7/2015 Mahdavifar et al.
2015/0229337 A1 8/2015 Alhussien et al.
2015/0381208 A1 12/2015 Li et al.
2016/0013810 A1 1/2016 Gross et al.
2016/0013931 A1 1/2016 Pisek et al.
2016/0087648 A1 3/2016 Korb et al.
2016/0164537 A1 6/2016 Pisek et al.
2016/0164629 A1 6/2016 Ahn et al.
2016/0173132 A1 6/2016 Cho
2016/0218750 A1 7/2016 Ma
2016/0380763 A1 12/2016 Ahn et al.
2017/0047947 A1 2/2017 Hong et al.
2017/0222663 A1 8/2017 Parthasarathy et al.
2017/0230149 A1 8/2017 Wang et al.
2017/0331494 A1 11/2017 Richardson et al.
2017/0353267 A1 12/2017 Kudekar et al.
2018/0226992 A1 8/2018 Panteleev et al.
2018/0367245 A1 12/2018 Soriaga et al.
2018/0367253 A1 12/2018 Nammi et al.
2019/0052400 A1 2/2019 Soriaga et al.
2019/0199475 A1 6/2019 Richardson et al.
2019/0245654 A1 8/2019 Richardson et al.
2019/0260507 A1 8/2019 Lin et al.
2019/0280817 A1 9/2019 Kudekar et al.
2019/0356337 A1 11/2019 Richardson et al.
2020/0059317 A1 2/2020 Patel et al.

FOREIGN PATENT DOCUMENTS

CN 102017426 A 4/2011
CN 102437858 A 5/2012
CN 102651652 A 8/2012
CN 102783206 A 11/2012
CN 103188044 A 7/2013
CN 103746708 A 4/2014

(56) References Cited

FOREIGN PATENT DOCUMENTS

| | | | |
|---|---|---|---|
| CN | 103780329 | A | 5/2014 |
| CN | 105227189 | A | 1/2016 |
| CN | 105284053 | A | 1/2016 |
| CN | 105306165 | A | 2/2016 |
| CN | 105337696 | A | 2/2016 |
| CN | 106341138 | A | 1/2017 |
| EP | 1601109 | A2 | 11/2005 |
| EP | 2091171 | A2 | 8/2009 |
| EP | 2096760 | A1 | 9/2009 |
| EP | 2899912 | A1 | 7/2015 |
| EP | 3264611 | A1 | 1/2018 |
| RU | 2520406 | C2 | 6/2014 |
| TW | 200711359 | A | 3/2007 |
| WO | WO-2002062002 | A1 | 8/2002 |
| WO | WO-2008052202 | A1 | 5/2008 |
| WO | WO-2008092040 | A2 | 7/2008 |
| WO | WO-2009011134 | A1 | 1/2009 |
| WO | WO-2014127140 | A1 | 8/2014 |
| WO | WO-2015139297 | A1 | 9/2015 |
| WO | WO-2017091244 | A1 | 6/2017 |
| WO | WO-2017209837 | A1 | 12/2017 |
| WO | WO-2018029633 | A1 | 2/2018 |
| WO | WO-2018030927 | A1 | 2/2018 |
| WO | WO-2018128560 | A1 | 7/2018 |
| WO | WO-2018144560 | A1 | 8/2018 |

OTHER PUBLICATIONS

Liu J., et al., "Rate-Compatible LDPC Codes with Short Block Lengths Based on Puncturing and Extension Techniques," 2014, pp. 1-20.
Abbasfar A., et al., "Accumulate Repeat Accumulate Codes", Dec. 2, 2003, XP002585965, Retrieved from the Internet: URL: http://trs-new.jpl.nasa.gov/dspace/bitstream/2014/8047/1/03-3469.pdf [retrieved on Jun. 4, 2010], 6 pages.
Alcatel-Lucent et al., "LDPC Coding Proposal for LBC", 3GPP2 Draft; C30-20070226-002_C30-20070212-034R1_AHLQRZ_LDPC_Proposal_for_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,2007.02.26/ pp. 1-27.
Alcatel-Lucent et al., "LDPC Coding Proposal for LBC", 3GPP2-Drafts, 2500 Wilson Boulevard, Suite 300, Arlington, Virginia 22201, USA, Mar. 15, 2007, XP040477608, 32 pages.
Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.
Arikan E., "Challenges and some new directions in channel coding," Computer Science, Information Theory, arXiv:1504.03916, Apr. 15, 2015, 11 pages.
Arikan E., "Channel Polarization: a Method for Constructing Capacity-Achieving Codes for Symmetric Binary-Input Memoryless Channels", IEEE Transactions on Information Theory, IEEE Press, USA, vol. 55, No. 7, Jul. 1, 2009 (Jul. 1, 2009), pp. 3051-3073, XP080428257, ISSN: 0018-9448.
Chen B., et al., "List Viterbi Algorithms for Continuous Transmission", IEEE Transactions on Communications, vol. 49 No. 5, XP011009921, May 1, 2001, pp. 784-792.
Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.
Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].
Deng X., et al., "Segmented Cyclic Redundancy Check: A Data Protection Scheme for Fast Reading RFID Tag's Memory," IEEE Wireless Communications and Networking Conference, 2008, pp. 1576-1581.
El-Khamy M., et al., "Binary Polar Codes are Optimized Codes for Bitwise Multistage Decoding", Computer Science, Information Theory,Arxiv.org, Cornell University Library, 201 Olin Library Cornell University Ithaca, NY 14853, Apr. 12, 2016, XP080695103, DOI: 10.1049/EL.2016.0837, 2 pages.
El-Khamy M., et al., "Design of Rate Compatible Structured LDPC Codes for Hybrid ARQ Applications", IEEE, Aug. 1, 2009, vol. 27(6), pp. 965-973.
Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; Feb. 13, 2017-Feb. 17, 2017, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].
Ericsson: "Performance and Complexity of Per-Segment CRC Attachment Methods" 3GPP Draft; R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007, XP050107330, 3 pages.
Ericsson: "System Information for Low Complexity and Extended Coverage", 3GPP Draft; R1-1708730—Sysinfo for Low Complexity and Ext Coverage, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 7, 2017, XP051263297, Retrieved from the Internet: URL:http://www.3gpp.org/ftp/tsg_ran/WG1_RL1/TSGR1_89/Docs/ [retrieved on May 7, 2017], 3 pages.
Examiner Requisition for CA03021881 dated Nov. 7, 2018.
Examiner Requisition for CA03021881 dated Jan. 28, 2019.
Guo J., et al., "Multi-CRC Polar Codes and Their Applications", IEEE Communications Letters, IEEE Service Center, Piscataway, NJ, US, vol. 20, No. 2, Feb. 1, 2016 (Feb. 1, 2016), pp. 212-215, XP011598246, ISSN: 1089-7798, D0I:10.1109/LCOMM.2015.2508022, [retrieved on Feb. 8, 2016], Abstract, Sections II, ILL, IV.
Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].
IEEE: "IEEEStd 802.16e-2005, Air Interface for Fixed and Mobile Broadband Wireless Access Systems," Amendment 2 and Corrigendum 1 to IEEE Std 802.16-2004, IEEE STD 802.16E-2005, Feb. 28, 2006 (Feb. 28, 2006), pp. 626-630, XP002515198.
"IEEE Standard for Local and Metropolitan Area Networks Part 16: Air Interface for Broadband Wireless Access Systems; IEEE Std 802.16-2009 (Revision of IEEE Std 802.16-2004)", May 29, 2009, XP068045637, ISBN: 978-0-7381-5919-5, pp. 1-2080.
Interdigital Inc: "Code Block Segmentation for Data Channel", 3GPP Draft; R1-1710958, Code Block Segmentation for Data Channel, 3rd Generation Partnership Project (3GPP), Mobile Competence Centre; 650 Route Des Lucioles; F-06921, Sophia-Antipolis Cedex; France, vol. RAN WG1, No. Qingdao; Jun. 27, 2017-Jun. 30, 2017, Jun. 26, 2017 (Jun. 26, 2017), XP051300159, Retrieved from the Internet: URL: http://www.3gpp.org/ftp/Meetings_3GPP_SYNC/RAN1/Docs/ [retrieved on Jun. 26, 2017].
Jiang M., et al., "An Improved Variable Length Coding Scheme Using Structured LDPC Codes", IEEE, Oct. 1, 2010, 5 Pages.
Jun Lin et al., "A reduced latency list decoding algorithm for polar codes", 2014 IEEE Workshop on Signal Processing Systems (SIPS), Oct. 1, 2014, p. 1-6.
Leroux C., et al., "A Semi-Parallel Successive-Cancellation Decoder for Polar Codes," IEEE Transactions on Signal Processing, Jan. 2013, vol. 61, No. 2, pp. 1-11.
Lucas R et al., "Improved Soft-Decision Decoding of Reed-Muller Codes as Generalized Multiple Concatenated Codes", ITG-FACHBERI, vol. 183, VDE-VERLAG, DE, No. 146, Mar. 5, 1998, pp. 137-142.
Mackay D.J.C., "Good Error-Correcting Codes Based on Very Sparse Matrices," IEEE Transactions on Information Theory, Mar. 1999, vol. 45 (2), pp. 399-431.

(56) References Cited

OTHER PUBLICATIONS

Mahdavifar H., et al., "Fast Multi-dimensional Polar Encoding and Decoding," Information Theory and Applications Workshop (ITA), IEEE, 2014, 5 pages.
Mahdavifar H., et al., "On the Construction and Decoding of Concatenated Polar Codes", IEEE International Symposium on Information Theory, Jul. 7, 2013, pp. 952-956, XP032497043, ISSN: 2157-8095, DOI: 10.1109/ISIT.2013.6620367 [retrieved on Oct. 3, 2013].
Mediatek Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ran/WG1_RL1/TSGR1_88b/Docs/, 14 pages.
Myung S., et al., "Extension of Quasi-cyclic LDPC Codes by Lifting," Proc ., IEEE International Symposium on Information Theory, ISIT 2005, Adelaide, Australia, Sep. 4, 2005 (Sep. 4, 2005)-Sep. 9, 2005 (Sep. 9, 2005), pp. 2305-2309, XP010845965, ISBN: 978-0-7803-9151-2.
Myung S., et al., "Lifting Methods for Quasi-Cyclic LDPC Codes", IEEE Communications Letters, Jun. 2006, vol. 10, No. 6, pp. 489-491.
Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.
Niu K., et al., "CRC-Aided Decoding of Polar Codes," IEEE Communications Letters, Oct. 2012, vol. 16, No. 10, pp. 1668-1671.
Nokia et al., "LDPC Design for eMBB", 3GPP Draft; R1-1705857_LDPC Design for EMBB, 3rd Generation Partnership Project (3GPP), Mobile Competence Centre; 650, Route Des Lucioles; F-06921 Sophia-Antipolis Cedex; France, vol. RAN WG1, No. Spokane, WA, USA; Apr. 3, 2017-Apr. 7, 2017 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.
Qualcomm Incorporated: "LDPC Codes—HARQ, Rate", 3GPP Draft; R1-162209, LDPC_Ratecompatibility_Highleveldesign, 3rd Generation Partnership Project (3GPP), Mobile Competence Centre, 650, Route Des Lucioles ; F06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.
Qualcomm Incorporated: "LDPC Design Overview", 3GPP TSG-RAN WG1#85, R1-164697, May 2016, pp. 1-5, URL:http://www.3gpp.org/ftp/tsg_ran/WG1_RL1/TSGR1_812/Docs/R1-164697.zip.
Qualcomm Incorporated: "LDPC Rate Compatible Design Overview" [online], 3GPP Draft, 3GPP TSG-RAN WG1#86bis, R1-1610137, 3rd Generation Partnership Project (3GPP), Mobile Competence Centre, 650, Route Des Lucioles, F-06921, Sophia-Anti Polis Cedex, vol. RAN WG1. No. Lisbon, Portugal, Oct. 9, 2016, 27 Pages, XP051150160, Retrieved from the Internet: URL: http://www.3gpp.org/ftp/Meetings_3GPP_SYNC/RAN1/Docs/ [retrieved on Oct. 9, 2016].
Qualcomm Incorporated: "LDPC Rate Matching", 3GPP Draft; R1-1708640_LDPC Rate_Matching, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 14, 2017, XP051273827, Retrieved from the Internet: URL:http://www.3gpp.org/ftp/Meetings_3GPP_SYNC/RAN1/Docs/ [retrieved on May 14, 2017], 3 pages.
Qualcomm Incorporated: "LDPC Segmentation", 3GPP Draft; R1-1711211, LDPC Segmentation, 3rd Generation Partnership Project (3GPP), Mobile Competence Centre, 650, Route Des Lucioles, F-06921, Sophia-Antipolis Cedex, France, vol. RAN WG1, No. Qingdao, China; Jun. 27, 2017-Jun. 30, 2017, Jun. 26, 2017 (Jun. 26, 2017), XP051300410, pp. 1-6, Retrieved from the Internet: URL: http://www.3gpp.org/ftp/Meetings_3GPP_SYNC/RAN1/Docs/ [retrieved on Jun. 26, 2017].
Qualcomm Incorporated: "Polar code design overview", 3GPP Draft, 3GPP TSG-RAN WG1 #85, R1-164699_Polar_Design_Overview, 3rd Generation Partnership Project (3GPP), Mobile Competence Centre, 650, Route Des Lucioles, F-06921 Sophia-Antipolis Cedex, France, vol. RAN WG1, No. Nanjing, China, May 23, 2016-May 27, 2016 May 14, 2016 (May 14, 2016), XP051089936, 3 pages, Retrieved from the Internet:URL:http://www.3gpp.org/ftp/tsg_ran/WG1_RL1/TSGR1_85/Docs/ [retrieved on May 14, 2016].
Richardson T., et al., "Design of Low-Density Parity Check Codes for 5G New Radio," IEEE Communications Magazine, vol. 56 (3), Mar. 1, 2018, pp. 28-34, XP055480192.
Richardson T., et al., "LDPC Proposal Update", 3GPP2-Drafts, Dec. 18, 2006 (Dec. 18, 2006), pp. 1-30, XP040476671, ftp://ftp.3gpp2.org/TSGC/Working/2007/2007-01-Vancouver/TSG-C-2007-01-Vancouver/WG3/Distribution%202006.12.18/C30-20061218-004_QCOM_LDPC_proposal_update.pdf.
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Shea J.M., et al., "Multidimensional Codes" In: "Wiley Encyclopedia of Telecommunications," Jan. 1, 2003, vol. 3, pp. 1538-1551, XP055402230.
Shi L., "Research on Polar Code Characters and its Encoding and Decoding Method", Chinese Master's Theses Full-Text Database, Information Science and Technology, Issue No. 12, Dec. 15, 2015.
Stolte N., Rekursive Codes mit der Plotkin-Konstruktion und ihre Decodierung, D17 Darmstadter Dissertation, Jan. 1, 2002, 151 pages, (in particular, pp. 13-30), XP055241445, URL:http:I/tuprints.ulb.tu-darmstadt.de/epda/000183/stolte.pdf, Techn. Universitat, Diss., 2002 (Nicht f. d. Austausch)_Darmstadt [retrieved on Jan. 14, 2016].
Supplementary European Search Report—EP16910045—Search Authority—Munich—dated Feb. 27, 2020.
Surra S.A., et al., "Gigabit Rate Achieving Low-Power LDPC Codes: Design and Architecture", IEEE, Mar. 1, 2011, pp. 1994-1999.
Taiwan Search Report—TW105126943—TIPO—dated Nov. 13, 2019.
Tal I., et al., "List Decoding of Polar Codes", IEEE Transactions on Information Theory, Institute of Electrical and Electronics Engineers, May 2015, vol. 61, No. 5, pp. 2213-2226.
Tal I., et al., "List Decoding of Polar Codes", International Symposium on Information Theory proceedings, ISIT 2011, St. Petersburg, Russia, Jul. 31-Aug. 5, 2011, May 31, 2012 (May 31, 2012), pp. 1-11, XP055225954, Piscataway, NJ, ISBN: 978-1-4577-0596-0, Retrieved from the Internet: URL: http://arxiv.org/pdf/1206.0050.pdf [retrieved on Nov. 4, 2015] sections II-III.
Trifonov P., "Efficient Design and Decoding of Polar Codes", IEEE Transactions on Communications, IEEE Service Center, Piscataway, NJ, USA, vol. 60, No. 11, Nov. 1, 2012 (Nov. 1, 2012), XP011473857, pp. 3221-3227, ISSN: 0090-6778, DOI: 10.1109/TCOMM.2012.081512.110872.
Trifonov P., et al., "Generalized Concatenated Codes based on Polar Codes", 8th International Symposium on Wireless Communication Systems, Nov. 6, 2011, XP032090122, pp. 442-446, DOI: 10.1109/ISWCS.2011.6125399, ISBN: 978-1-61284-403-9.
Trifonov P., et al., "Fast Encoding of Polar Codes with Reed-Solomon Kernel," IEEE Transactions on Communications, May 2016, pp. 1-8.
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [Retrieved on Dec. 8, 2016].
Wang Y., et al., "Concatenations of Polar Codes With Outer BCH Codes and Convolutional Codes", 2014 52nd Annual Allerton Conference on Communication, Control, and Computing (ALLERTON), Sep. 30, 2014, pp. 813-819, XP032731136, DOI: 10.1109/ALLERTON.2014.7028538 [retrieved on Jan. 30, 2015].
Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.

(56) References Cited

OTHER PUBLICATIONS

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016], Abstract, Sections III.
ZTE: "NR LDPC Design", 3GPP Draft; R1-1709289, NR LDPC design, 3rd Generation Partnership ProjecT (3GPP), Mobile Competence Centre; 650, Route Des Lucioles; F-06921, Sophia-Antipolis Cedex; France, vol. RAN WG1, No. Hangzhou, China; May 15, 2017-May 19, 2017, May 16, 2017 (May 16, 2017), XP051285041, pp. 1-12, Retrieved from the Internet: URL: http://www.3gpp.org/ftp/tsg_ran/WG1_RL1/TSGR1_89/Docs/ [retrieved on May 16, 2017].
ZTE: "Structured LDPC Coding with Rate Matching", 3GPP Draft; R1-060115, Mobile Competence Centre; 650, Route Des Lucioles; F-06921 Sophia-Antipolis Cedex; France, vol. RAN WG1, No. Helsinki, Finland; Jan. 19, 2006, 13 Pages, XP050950962, Retrieved from the Internet: URL:http://www.3gpp.org/ftp/tsg_ran/WG1_RL1/TSGR1_AH/LTE_AH_0601/Docs/.
Ericsson: "Implementation and Performance of LDPC Decoder", 3GPP TSG RAN WG1 AH_NR Meeting R1-1700111, Jan. 20, 2017, 8 Pages.
Intel Corporation: "LDPC Code Design for NR", 3GPP TSG RAN WG1 Meeting #85, 3GPP Draft; R1-164183, 3rd Generation Partnership Project (3GPP), Mobile Competence Centre; 650, Route Des Lucioles; F-06921 Sophia-Antipolis Cedex; France, vol. RAN WG1, No. Nanjing, China; May 23, 2016-May 27, 2016, May 14, 2016 (May 14, 2016), 4 Pages, XP051090075, Retrieved from the Internet: URL: http://www.3gpp.org/ftp/tsg_ran/WG1_RL1/TSGR1_85/Docs/ [retrieved on May 14, 2016] p. 1-p. 3.
CNIPA, "Notice on the First Office Action" dated Jun. 18 2020, 19 pages (Native language CNIPA Office Action and English-language translation provided by foreign counsel).

* cited by examiner

400A $$H = \begin{bmatrix} 1 & 1 & 1 & 0 & 0 \\ 1 & 0 & 0 & 1 & 1 \\ 1 & 1 & 0 & 0 & 1 \\ 0 & 1 & 1 & 1 & 0 \end{bmatrix} \quad x = \begin{bmatrix} x_1 \\ x_2 \\ x_3 \\ x_4 \\ x_5 \end{bmatrix}$$

1500

| $v_{\vec{b},\vec{d}}$ | $v_{\vec{b},\vec{d}}n$ | $\vec{b}$ | $\vec{d}$ | $\mu_{\vec{d}}$ | $\mu_{\vec{d}}n$ | $\vec{d}$ |
|---|---|---|---|---|---|---|
| 0.0416667 | 1 | 0 1 | 0 3 0 0 | 0.833333 | 2 | 1 1 15 2 |
| 0.833333 | 20 | 0 1 | 0 0 3 0 | 0.0416667 | 1 | 2 0 16 1 |
| 0.0416667 | 1 | 1 0 | 0 0 0 6 | 0.0416667 | 1 | 2 1 14 1 |
| 0.125 | 3 | 0 1 | 2 0 0 0 | | | |

1600

| $v_{\vec{b},\vec{d}}$ | $v_{\vec{b},\vec{d}}n$ | $\vec{b}$ | $\vec{d}$ | $\mu_{\vec{d}}$ | $\mu_{\vec{d}}n$ | $\vec{d}$ |
|---|---|---|---|---|---|---|
| 0.0434783 | 1 | 1 0 | 4 0 0 0 | 0.0434783 | 1 | 1 17 1 1 |
| 0.391304 | 9 | 0 1 | 0 4 0 0 | 0.0434783 | 1 | 1 17 0 2 |
| 0.434783 | 10 | 0 1 | 0 3 0 0 | 0.0434783 | 1 | 1 16 1 2 |
| 0.0434783 | 1 | 0 1 | 0 0 3 0 | 0.0434783 | 1 | 1 16 1 1 |
| 0.130435 | 3 | 0 1 | 0 0 0 2 | | | |

PUNCTURING FOR STRUCTURED LOW DENSITY PARITY CHECK (LDPC) CODES

CROSS-REFERENCE TO RELATED APPLICATION & PRIORITY CLAIM

This application claims benefit of and priority to U.S. Provisional Patent Application Ser. No. 62/254,678, filed Nov. 12, 2015, which is herein incorporated by reference in its entirety for all applicable purposes.

BACKGROUND

Technical Field

Certain aspects of the present disclosure generally relate to methods and apparatus for puncturing of structured low density parity check (LDPC) codes. Certain aspects can enable improved performance to capacity.

INTRODUCTION

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include Code Division Multiple Access (CDMA) systems, Time Division Multiple Access (TDMA) systems, Frequency Division Multiple Access (FDMA) systems, 3rd Generation Partnership Project (3GPP) Long Term Evolution (LTE) systems, Long Term Evolution Advanced (LTE-A) systems, and Orthogonal Frequency Division Multiple Access (OFDMA) systems.

Generally, a wireless multiple-access communication system can simultaneously support communication for multiple wireless nodes. Each node communicates with one or more base stations via transmissions on forward and reverse links. The forward link (or downlink) refers to a communication link from base stations to nodes, and a reverse link (or uplink) refers to a communication link from nodes to base stations. Communication links may be established via a single-input single-output, multiple-input single-output, or a multiple-input multiple-output (MIMO) system.

In the modern information age, binary values (e.g., ones and zeros), are used to represent and communicate various types of information, such as video, audio, statistical information, etc. Unfortunately, during storage, transmission, and/or processing of binary data, errors may be unintentionally introduced; for example, a one may be changed to a zero or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a one or a zero) together with some indication of the reliability of that estimate. While the number of errors may be relatively low, even a small number of errors or level of distortion can result in the data being unusable or, in the case of transmission errors, may necessitate retransmission of the data.

In order to provide a mechanism to check for errors and, in some cases, to correct errors, binary data can be coded to introduce carefully designed redundancy. Coding of a unit of data produces what is commonly referred to as a code word. Because of its redundancy, a code word will often include more bits than the input unit of data from which the code word was produced.

Redundant bits are added by an encoder to the transmitted bit stream to create a code word. When signals arising from transmitted code words are received or processed, the redundant information included in the code word as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data.

With the increased use of fiber optic lines for data communication and increases in the rate at which data can be read from and stored to data storage devices, (e.g., disk drives, tapes, etc.), there is an increasing need not only for efficient use of data storage and transmission capacity but also for the ability to encode and decode data at high rates of speed.

While encoding efficiency and high data rates are important, for an encoding and/or decoding system to be practical for use in a wide range of devices (e.g., consumer devices), it is important that the encoders and/or decoders be capable of being implemented at reasonable cost.

Communication systems often need to operate at several different rates. One way to keep the implementation as simple as possible and to provide for the coding and decoding at the different rates is to use low-density-parity check (LDPC) codes. In particular, the LDPC codes are used to generate higher-rate codes by puncturing lower-rate codes. Techniques for improved performance of LDPC codes are desirable.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure generally relate to methods and apparatus for puncturing of structured low density parity check (LDPC) codes. In some scenarios, highest degree variable nodes of a 5/6 code rate Wi-Fi LDPC code (e.g., an LDPC code defined by the 802.11 wireless standard) can be punctured to provide a 7/8 code rate for the LDPC code. In some scenarios, a multi-edge LDPC code design having an extra variable node can be punctured to provide a 7/8 code rate LDPC code.

Certain aspects of the present disclosure provide a method for wireless communications by a transmitting device. The method generally includes encoding a set of information bits based on a LDPC code to produce a code word, the LDPC code defined by a matrix having a first number of variable nodes and a second number of check nodes, puncturing the code word to produce a punctured code word, wherein the puncturing is performed according to a first puncturing pattern designed to puncture bits corresponding to one or more of the variable nodes having a certain degree of connectivity to the check nodes, and transmitting the punctured code word.

Certain aspects of the present disclosure provide a method for wireless communications by a transmitting device. The method generally includes encoding a set of information bits based on a multi-edge LDPC code to produce a code word, the LDPC code defined by a matrix having a first number of variable nodes including an extra variable node, relative to a reference LDPC code, and a second number of check nodes; puncturing the code word to produce a punctured code word, wherein the puncturing is performed according to a \puncturing pattern designed to puncture bits corresponding to one or more of the variable nodes to achieve a certain code rate for the punctured code word; and transmitting the punctured code word.

Certain aspects of the present disclosure provide an apparatus for wireless communications such as a transmitting device. The apparatus generally includes means for encoding a set of information bits based on a LDPC code to produce a code word, the LDPC code defined by a matrix having a first number of variable nodes and a second number of check nodes, means for puncturing the code word to produce a punctured code word, wherein the puncturing is performed according to a first puncturing pattern designed to puncture bits corresponding to one or more of the variable nodes having a certain degree of connectivity to the check nodes, and means for transmitting the punctured code word.

Certain aspects of the present disclosure provide an apparatus for wireless communications such as a transmitting device. The apparatus generally includes means for encoding a set of information bits based on a multi-edge LDPC code to produce a code word, the LDPC code defined by a matrix having a first number of variable nodes including an extra variable node, relative to a reference LDPC code, and a second number of check nodes; means for puncturing the code word to produce a punctured code word, wherein the puncturing is performed according to a puncturing pattern designed to puncture bits corresponding to one or more of the variable nodes to achieve a certain code rate for the punctured code word; and means for transmitting the punctured code word.

Certain aspects of the present disclosure provide an apparatus for wireless communications such as a transmitting device. The apparatus generally includes at least one processor configured to encode a set of information bits based on a LDPC code to produce a code word, the LDPC code defined by a matrix having a first number of variable nodes and a second number of check nodes and puncture the code word to produce a punctured code word, wherein the puncturing is performed according to a first puncturing pattern designed to puncture bits corresponding to one or more of the variable nodes having a certain degree of connectivity to the check nodes; and a transmitter configured to transmit the punctured code word.

Certain aspects of the present disclosure provide an apparatus for wireless communications such as a transmitting device. The apparatus generally includes at least one processor configured to encode a set of information bits based on a multi-edge LDPC code to produce a code word, the LDPC code defined by a matrix having a first number of variable nodes including an extra variable node, relative to a reference LDPC code, and a second number of check nodes and puncture the code word to produce a punctured code word, wherein the puncturing is performed according to a puncturing pattern designed to puncture bits corresponding to one or more of the variable nodes to achieve a certain code rate for the punctured code word; and a transmitter configured to transmit the punctured code word.

Certain aspects of the present disclosure provide a computer readable medium having computer executable code stored thereon. The computer executable code generally includes code for encoding a set of information bits based on a LDPC code to produce a code word, the LDPC code defined by a matrix having a first number of variable nodes and a second number of check nodes, code for puncturing the code word to produce a punctured code word, wherein the puncturing is performed according to a first puncturing pattern designed to puncture bits corresponding to one or more of the variable nodes having a certain degree of connectivity to the check nodes, and code for transmitting the punctured code word.

Certain aspects of the present disclosure provide a computer readable medium having computer executable code stored thereon. The computer executable code generally includes code for encoding a set of information bits based on a multi-edge LDPC code to produce a code word, the LDPC code defined by a matrix having a first number of variable nodes including an extra variable node, relative to a reference LDPC code, and a second number of check nodes, code for puncturing the code word to produce a punctured code word, wherein the puncturing is performed according to a puncturing pattern designed to puncture bits corresponding to one or more of the variable nodes to achieve a certain code rate for the punctured code word; and code for transmitting the punctured code word.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
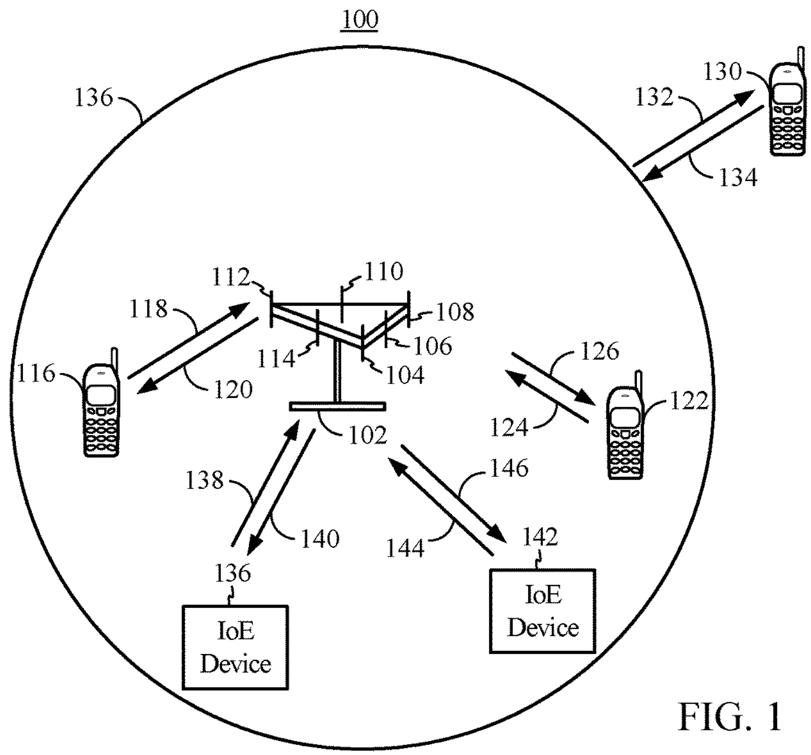
FIG. 1 illustrates an example multiple access wireless communication system, in accordance with certain aspects of the present disclosure.

Aspects of the present disclosure provide techniques for puncturing of low density parity check (LDPC) codes. In some scenarios, highest degree variable nodes of a 5/6 code rate Wi-Fi LDPC code (e.g., an LDPC code defined by the 802.11 wireless standard) can be punctured to provide a 7/8 code rate for the LDPC code. In some scenarios, a multi-edge LDPC code having an extra variable node can be punctured to provide a 7/8 code rate for the LDPC code and maintaining a desired block length.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn great attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), medical devices or equipment, biometric sensors/devices, an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link.

It is noted that while aspects may be described herein using terminology commonly associated with 3G and/or 4G wireless technologies, aspects of the present disclosure can be applied in other generation-based communication systems, such as 5G and later.

An Example Wireless Communication System

FIG. 1 illustrates an example communications network 100 in which aspects of the present disclosure may be performed. For example, a transmitting device such as wireless node 116 or BS 102 can encode a set of information bits based on a low density parity check (LDPC) code to produce a code word, the LDPC code defined by a matrix having a first number of variable nodes and a second number of check nodes. The transmitting device can puncture the code word to produce a punctured code word. For example, the transmitting device can performed the puncturing according to a puncturing pattern. The transmitting device may puncture bits corresponding to one or more of the variable nodes having a certain degree of connectivity to the check nodes (e.g., a highest degree of connectivity). The transmitting device can then transmit the punctured code word.

Referring to FIG. 1, a multiple access wireless communication system 100 according to one aspect is illustrated. A base station (BS) 102 may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Wireless node 116 may be in communication with antennas 112 and 114, where antennas 112 and 114 transmit information to wireless node 116 over forward link 120 and receive information from wireless node 116 over reverse link 118. Wireless node 122 may be in communication with antennas 106 and 108, where antennas 106 and 108 transmit information to wireless node 122 over forward link 126 and receive information from wireless node 122 over reverse link 124. The BS 102 may also be in communication with other wireless nodes, which may be, for example, Internet-of-Everything (IoE) devices. IoE device 136 may be in communication with one or more other antennas of BS 102, where the antennas transmit information to IoE device 136 over forward link 140 and receive information from IoE device 136 over reverse link 138. IoE device 142 may be in communication with one or more other antennas of BS 102, where the antennas transmit information to IoE device 142 over forward link 146 and receive information from IoE device 142 over reverse link 144. In a Frequency Division Duplex (FDD) system, communication links 118, 120, 124, 126, 138, 140, 144, and 146 may use different frequency for communication. For example, forward link 120 may use a different frequency than that used by reverse link 118, and forward link 140 may use a different frequency than that used by reverse link 138.

Each group of antennas and/or the area in which they are designed to communicate is often referred to as a sector of the BS. In one aspect of the present disclosure, each antenna group may be designed to communicate to wireless nodes in a sector of the areas covered by access point 102.

Wireless node 130 may be in communication with BS 102, where antennas from the BS 102 transmit information to wireless node 130 over forward link 132 and receive information from the wireless node 130 over reverse link 134.

In communication over forward links 120 and 126, the transmitting antennas of BS 102 may utilize beamforming in order to improve the signal-to-noise ratio of forward links for the different wireless nodes 116, 122, 136, and 142. Also, a BS using beamforming to transmit to wireless nodes scattered randomly through its coverage causes less interference to wireless nodes in neighboring cells than a BS transmitting through a single antenna to all its wireless nodes.

Figure 2:
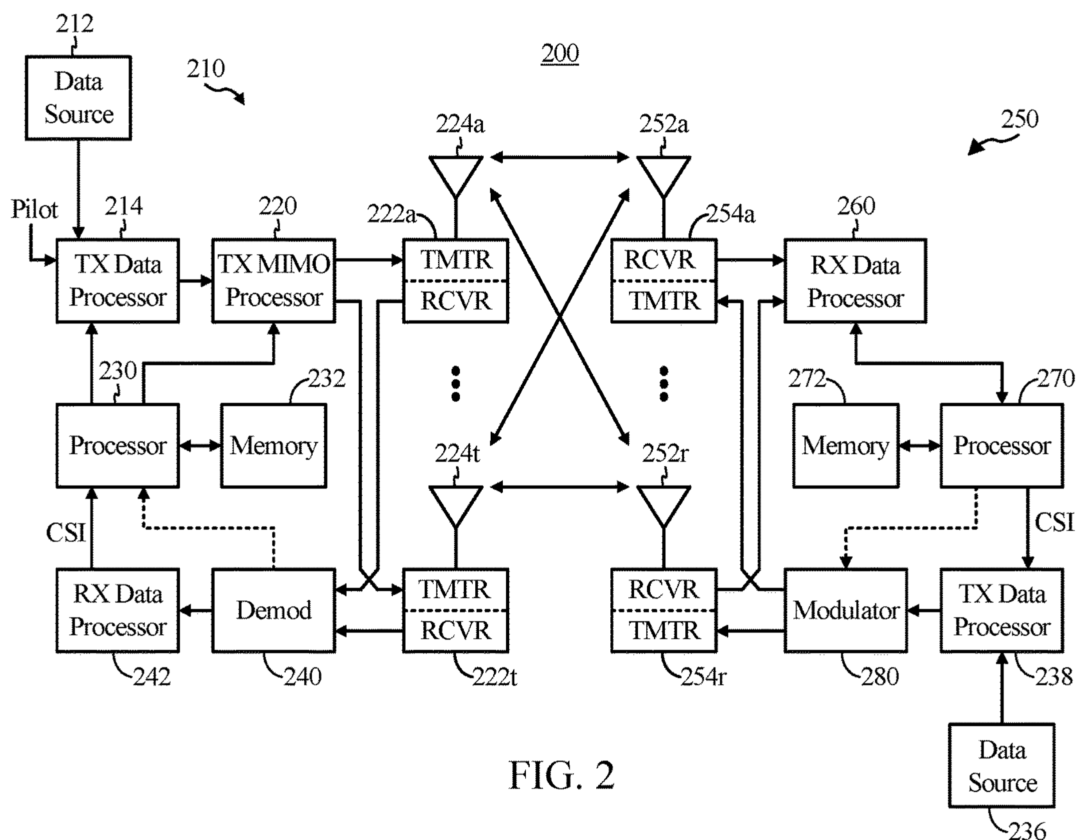
FIG. 2 illustrates a block diagram of a base station and a wireless node, in accordance with certain aspects of the present disclosure.

FIG. 2 illustrates a block diagram of an aspect of a transmitter system 210 (e.g., also known as the base station) and a receiver system 250 (e.g., also known as the wireless node) in a multiple-input multiple-output (MIMO) system 200. Each of system 210 and system 250 has capabilities to both transmit and receive. Whether system 210 or system 250 is transmitting, receiving, or transmitting and receiving simultaneously depends on the application. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data. According to aspects described herein, the coding scheme may use LDPC codes.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (e.g., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230. Memory 232 may store data and software/firmware for the transmitter system 210.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222*a* through 222*t*. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222*a* through 222*t* are then transmitted from $N_T$ antennas 224*a* through 224*t*, respectively.

At receiver system 250, the transmitted modulated signals may be received by $N_R$ antennas 252*a* through 252*r* and the received signal from each antenna 252 may be provided to a respective receiver (RCVR) 254*a* through 254*r*. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. Memory 272 may store data and software/firmware for the receiver system 250. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254*a* through 254*r*, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Any one of the processor 270, RX data processor 260, TX data processor 238, or other processors/elements, or a combination thereof of the wireless node 250 and/or any one of the processor 230, TX MIMO processor 220, TX data processor 214, RX data processor 242, or other processors/elements, or a combination thereof of the access point 210 may be configured to perform the procedures for connectionless access in accordance with certain aspects of the present disclosure discussed below. In an aspect, at least one of the processor 270, RX data processor 260, and TX data processor 238 may be configured to execute algorithms stored in memory 272 for performing the random-access channel (RACH) procedures for connectionless access described herein. In another aspect, at least one of the processor 230, TX MIMO processor 220, TX data processor 214, and RX data processor 242 may be configured to execute algorithms stored in memory 232 for performing the RACH procedures for connectionless access described herein.

Figure 3:
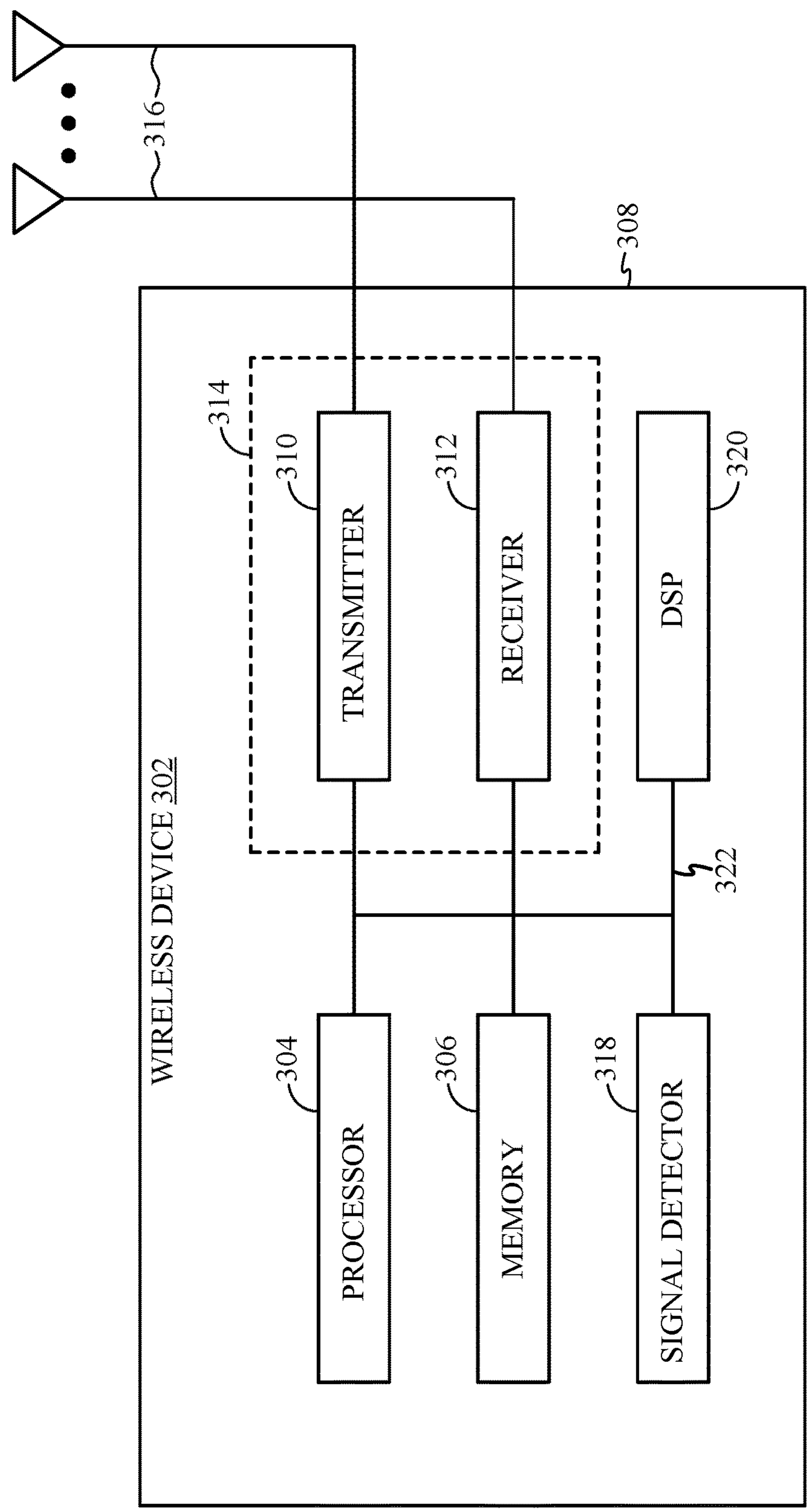
FIG. 3 illustrates various components that may be utilized in a wireless device, in accordance with certain aspects of the present disclosure.

FIG. 3 illustrates various components that may be utilized in a wireless device 302 that may be employed within the wireless communication system 100 illustrated in FIG. 1. The wireless device 302 is an example of a device that may be configured to implement the various methods described herein. The wireless device 302 may be a base station 102 or any of the wireless nodes (e.g., 116, 122, 136, and 142). For example, the wireless device 302 may be configured to perform operations 800 described in FIG. 8 (as well as other operations described herein).

The wireless device 302 may include a processor 304 that controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein, for example, to allow a UE to transmit data efficiently during a connectionless access. Some non-limiting examples of the processor 304 may include Snapdragon processor, application specific integrated circuits (ASICs), programmable logic, etc.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers. The wireless device 302 can also include wireless battery charging equipment.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

The various components of the wireless device 302 may be coupled together by a bus system 322, which may include a power bus, a control signal bus, and a status signal bus in addition to a data bus. The processor 304 may be configured to access instructions stored in the memory 306 to perform connectionless access, in accordance with aspects of the present disclosure discussed below.

Example Error Correction Coding

Many communications systems use error-correcting codes. Specifically, error correcting codes compensate for the intrinsic unreliability of information transfer in these systems by introducing redundancy into the data stream. Low density parity check (LDPC) codes (also known as Gallager codes) are a particular type of error correcting codes which use an iterative coding system. LDPC codes are linear block code in which most of the elements of its parity check matrix H are ‘0’.

LDPC codes can be represented by bipartite graphs (often referred to as “Tanner graphs”), wherein a set of variable nodes corresponds to bits of a code word (e.g., information bits or systematic bits), and a set of check nodes correspond to a set of parity-check constraints that define the code. Thus, the nodes of the graph are separated into two distinctive sets and with edges connecting nodes of two different types, variable and check.

A protograph is created by copying a bipartite base graph (G) a number of times, N. A variable node and a check node are considered “neighbors” if they are connected by an “edge” (i.e., the line connecting the variable node and the check node) in the graph. In addition, for each edge (e) of the bipartite base graph (G), a permutation is applied to the N copies of edge (e) to interconnect the N copies of G. A bit sequence having a one-to-one association with the variable node sequence is a valid code word if and only if, for each check node, the bits associated with all neighboring variable nodes sum to zero modulo two (i.e., they include an even number of 1’s). The resulting LDPC code may be quasi-cyclic (QC) if the permutations used are cyclic.

Figures 4, 4A:
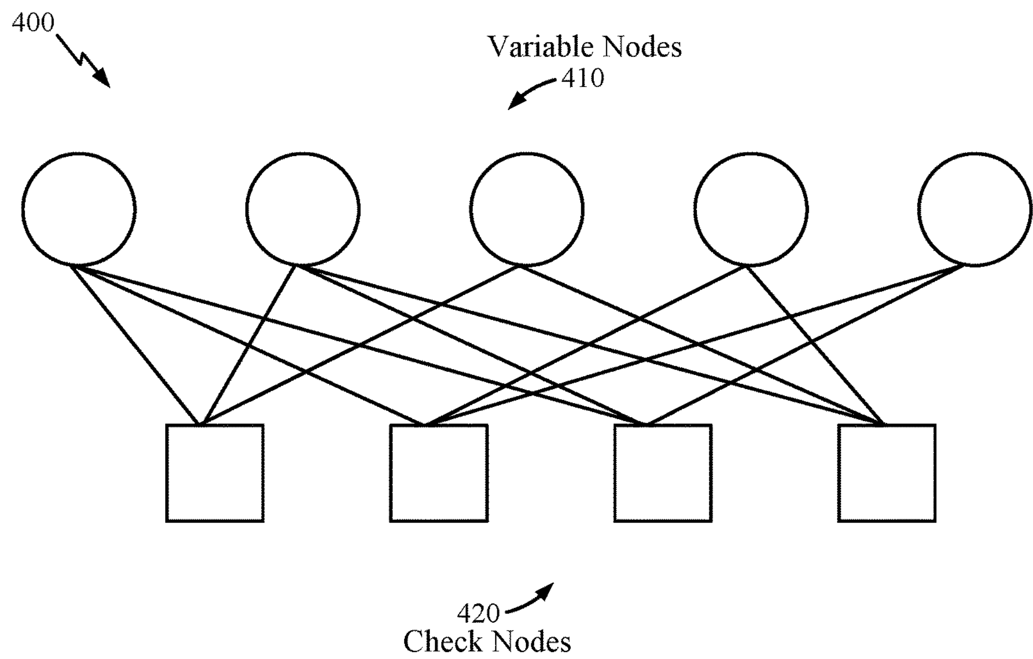
FIGS. 4-4A show graphical and matrix representations of an exemplary low density parity check (LDPC) code, in accordance with certain aspects of the present disclosure.

FIGS. 4-4A show graphical and matrix representations of an exemplary LDPC code, in accordance with certain aspects of the present disclosure. For example, FIG. 4 shows a bipartite graph 400 representing an exemplary LDPC code. The bipartite graph 400 includes a set of 5 variable nodes 410 (represented by circles) connected to 4 check nodes 420 (represented by squares). Edges in the graph 400 connect variable nodes 410 to the check nodes 420 (represented by the lines connecting the variable nodes 410 to the check nodes 420). This graph consists of |V|=5 variable nodes and |C|=4 check nodes, connected by |E|=12 edges.

The bipartite graph may be represented by a simplified adjacency matrix. FIG. 4A shows a matrix representation 400A of the bipartite graph 400. The matrix representation 400A includes a parity check matrix H and a code word vector x, where $x_1$-$x_5$ represent bits of the code word x. The parity matrix H is used for determining whether a received signal was normally decoded. The parity check matrix H has C rows corresponding to j check nodes and V columns corresponding to i variable nodes (i.e., a demodulated symbol), where the rows represent the equations and the columns represents the bits of the code word. In FIG. 4A, matrix H has 4 rows and 5 columns corresponding to 4 check nodes and 5 variable nodes respectfully. If a j-th check node is connected to an i-th variable node by an edge, i.e., the two nodes are neighbors, then there is a 1 in the i-th column and in the j-th row of the parity check matrix H. That is, the intersection of an i-th row and a j-th column contains a “1” where an edge joins the corresponding vertices and a “0” where there is no edge. The code word vector x represents a valid code word if and only if $H_x$=0 (e.g., if, for each constraint node, the bits neighboring the constraint (via their association with variable nodes) sum to zero modulo two, i.e., they comprise an even number of ones). Thus, if the code word is received correctly, then $H_x$=0 (mod 2). When the product of a coded received signal and the parity check matrix H becomes ‘0’, this signifies that no error has occurred. The parity check matrix is a C row by V column binary matrix. The rows represent the equations and the columns represent the digits in the code word.

The number of demodulated symbols or variable nodes is the LDPC code length. The number of non-zero elements in a row (column) is defined as the row (column) weight $d_c(d_v)$.

The degree of a node refers to the number of edges connected to that node. This feature is illustrated in the H matrix shown in FIG. 4A where the number of edges incident to a variable node 410 is equal to the number of 1’s in the corresponding column and is called the variable node degree d(v). Similarly, the number of edges connected with a check node 420 is equal to the number of ones in a corresponding row and is called the check node degree d(c).

A regular graph or code is one for which all variable nodes have the same degree and all constraint nodes have the same degree. In this case, we say that the code is a regular code. On the other hand, an irregular code has constraint nodes and/or variable nodes of differing degrees. For example, some variable nodes may be of degree 4, others of degree 3 and still others of degree 2.

“Lifting” enables LDPC codes to be implemented using parallel encoding and/or decoding implementations while also reducing the complexity typically associated with large LDPC codes. More specifically, lifting is a technique for generating a relatively large LDPC code from multiple copies of a smaller base code. For example, a lifted LDPC code may be generated by producing a number (Z) of parallel copies of the base graph and then interconnecting the parallel copies through permutations of edge clusters of each copy of the base graph.

Thus, a larger graph can be obtained by a “copy and permute” operation where multiple copies are overlaid so that same-type vertices are in close proximity, but the overall graph consists of multiple disconnected subgraphs.

Figure 5:
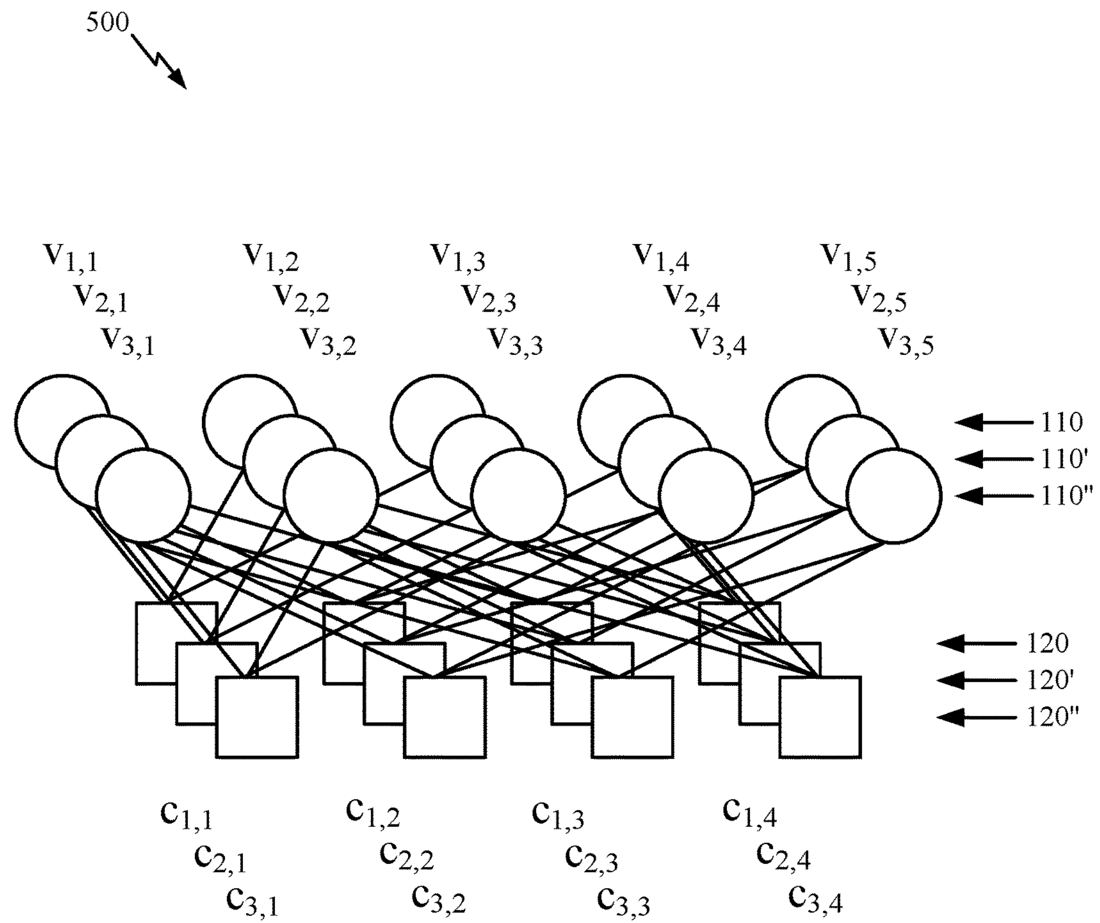
FIG. 5 graphically illustrates lifting of the LDPC code of FIG. 4A, in accordance with certain aspects of the present disclosure.

FIG. 5 graphically illustrates the effect of making three copies of the graph of FIG. 4. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To obtain derived graphs of different sizes, we can apply the “copy and permute” operation to a base graph.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times. For example, each variable node 410 in the graph 400 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). Or if the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. However, eliminating double edges in the LDPC code helps to avoid this extra complexity.

LDPC code designs based on cyclic lifting can be interpreted as codes over the ring of polynomials modulo may be binary polynomials modulo $x^Z-1$, where Z is the lifting size (e.g., the size of the cycle in the quasi-cyclic code). Thus encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint, that sockets must pair with sockets of like type, characterizes the multi-edge type concept. In a multi-edge type description, different node types can have different received distributions (e.g., the associated bits may go through different channels).

Puncturing is the act of removing bits from a code word to yield a shorter code word. Thus, punctured variable nodes correspond to code word bits that are not actually transmitted. Puncturing a variable node in an LDPC code creates a shortened code (e.g. due to the removal of a bit), while also effectively removing a check node. Specifically, for a matrix representation of an LDPC code, including bits to be punctured, where the variable node to be punctured has a degree of one (such a representation may be possible through row combining provided the code is proper), puncturing the variable node removes the associated bit from the code and effectively removes its single neighboring check node from the graph. As a result, the number of check nodes in the graph is reduced by one.

Figure 6:
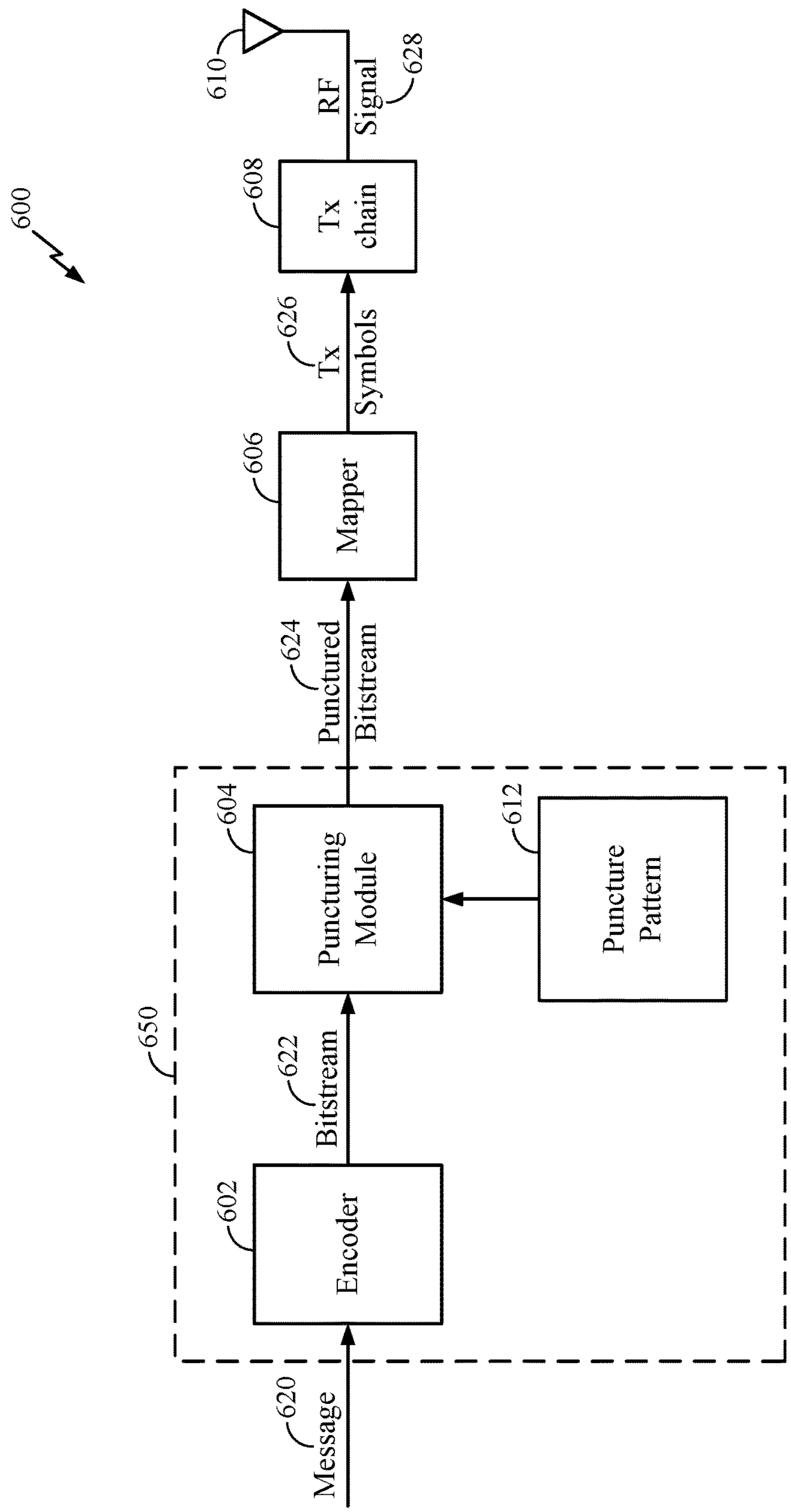
FIG. 6 is a simplified block diagram illustrating a puncturing encoder, in accordance with certain aspects of the present disclosure.

FIG. 6 is a simplified block diagram illustrating a puncturing encoder, in accordance with certain aspects of the present disclosure. FIG. 6 is a simplified block diagram 600 illustrating a portion of a radio frequency (RF) modem 650 that may be configured to provide a signal including a punctured encoded message for wireless transmission. In one example, a convolutional encoder 602 in a base station 102 (or an access terminal on the reverse path) receives a message 620 for transmission. The message 620 may contain data and/or encoded voice or other content directed to the receiving device. The encoder 602 encodes the message using a suitable modulation and coding scheme (MCS), typically selected based on a configuration defined by the base station 102 or another network entity. An encoded bit stream 622 produced by the encoder 602 may then be selectively punctured by a puncturing module 604, which may be a separate device or component, or which may be integrated with the encoder 602. The puncturing module 604 may determine that the bit stream should be punctured prior to transmission, or transmitted without puncturing. The decision to puncture the bit stream 622 is typically made based on network conditions, network configuration, RAN defined preferences and/or for other reasons. The bit stream 622 may be punctured according to a puncture pattern 612 and used to encode the message 620. The puncturing pattern may be according to certain aspect described in more detail below. The puncturing module 604 provides an output 624 to a mapper 606 that generates a sequence of Tx symbols 626 that are modulated, amplified and otherwise processed by Tx chain 608 to produce an RF signal 628 for transmission through antenna 610.

The output 624 of the puncturing module 604 may be the unpunctured bit stream 622 or a punctured version of the bit stream 622, according to whether the modem portion 650 is configured to puncture the bit stream 622. In one example, parity and/or other error correction bits may be punctured in the output 624 of the encoder 602 in order to transmit the message 620 within a limited bandwidth of the RF channel. In another example, the bit stream may be punctured to reduce the power needed to transmit the message 620, to avoid interference, or for other network-related reasons. These punctured code word bits are not transmitted.

The decoders and decoding algorithms used to decode LDPC code words operate by exchanging messages within the graph along the edges and updating these messages by performing computations at the nodes based on the incoming messages. Each variable node in the graph is initially provided with a soft bit, termed a received value, that indicates an estimate of the associated bit's value as determined by observations from, e.g., the communications channel. Ideally, the estimates for separate bits are statistically independent. This ideal may be violated in practice. A received word is comprised of a collection of received values.

Figure 7:
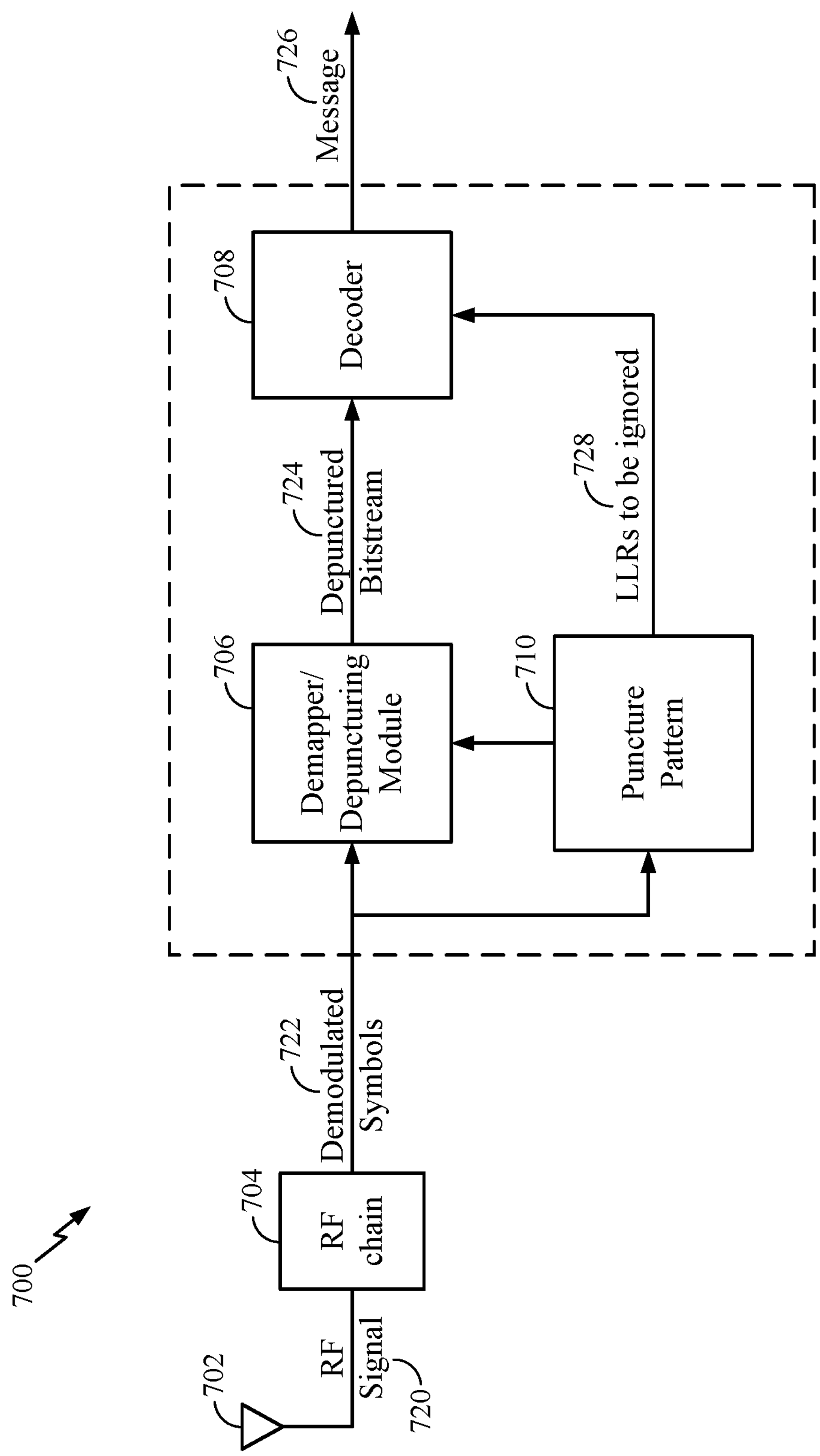
FIG. 7 is a simplified block diagram illustrating a decoder, in accordance with certain aspects of the present disclosure.

FIG. 7 is a simplified block diagram illustrating a decoder, in accordance with certain aspects of the present disclosure. FIG. 7 is a simplified schematic 700 illustrating a portion of a RF modem 750 that may be configured to receive and decode a wirelessly transmitted signal including a punctured encoded message. The punctured code word bits may be treated as erased. For example, the LLRs of the punctured nodes may be set to zero at initialization. In various examples, the modem 750 receiving the signal may reside at the access terminal, at the base station, or at any other suitable apparatus or means for carrying out the described functions. An antenna 702 provides an RF signal 720 to an access terminal. An RF chain 704 processes and demodulates the RF signal 720 and may provide a sequence of symbols 722 to a demapper 706, which produces a bit stream 724 representative of the encoded message.

The demapper 706 may provide a depunctured bit stream 724. In one example, the demapper 706 may include a depuncturing module that can be configured to insert null values at locations in the bit stream at which punctured bits were deleted by the transmitter. The depuncturing module may be used when the puncture pattern 710 used to produce the punctured bit stream at the transmitter is known. According to certain aspects disclosed herein, the puncture pattern 710 can be used to identify log-likelihood ratios (LLRs) 728 that may be ignored during decoding of the bit stream 724 by the convolutional decoder 708. The LLRs may be associated with a set of depunctured bit locations in the bit stream 724. Accordingly, the decoder 708 may produce the decoded message 726 with reduced processing overhead by ignoring the identified LLRs 728. For some aspects, the LDPC decoder may include a plurality of processing elements to perform the parity check or variable node operations in parallel. For example, when processing a code word with lifting size Z, the LDPC decoder may utilize a number (Z) of processing elements to perform parity check operations on all Z edges of a lifted graph, concurrently.

According to certain aspects disclosed herein, processing efficiency of a decoder 708 may be improved by configuring the decoder 708 to ignore LLRs 728 that correspond to punctured bits in a message transmitted in a punctured bit stream 722. The punctured bit stream 722 may have been punctured according to a puncturing scheme that defines certain bits to be removed from an encoded message. In one example, certain parity or other error-correction bits may be removed. A puncturing pattern may be expressed in a puncturing matrix or table that identifies the location of bits to be punctured in each message. A puncturing scheme may be selected to reduce processing overhead used to decode the message 726 while maintaining compliance with data rates on the communication channel and/or with transmission power limitations set by the network. A resultant punctured bit stream typically exhibits the error-correcting characteristics of a high rate error-correction code, but with less redundancy. Accordingly, puncturing may be effectively employed to reduce processing overhead at the decoder 708 in the receiver when channel conditions produce a relatively high signal to noise ratio.

A convolutional decoder 708 may be used to decode m-bit information strings from a bit stream that has been encoded using a convolutional code. The decoder 708 may comprise a Viterbi decoder, an algebraic decoder, or another suitable decoder. In one example, a Viterbi decoder employs the well-known Viterbi algorithm to find the most likely sequence of signaling states (the Viterbi path) that corresponds to a received bit stream 724. The bit stream 724 may be decoded based on a statistical analysis of LLRs calculated for the bit stream 724. In one example, a Viterbi decoder may compare and select the correct Viterbi path that defines a sequence of signaling states using a likelihood ratio test to generate LLRs from the bit stream 724. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bit stream 724.

At the receiver, the same decoder used for decoding non-punctured bitstreams can typically be used for decoding punctured bitstreams, regardless of how many bits have been punctured. In conventional receivers, the LLR information is typically de-punctured before decoding is attempted by filling LLRs for punctured states or positions (de-punctured LLRs) with zeros. A decoder may disregard de-punctured LLRs that effectively carry no information.

Example Puncturing for Structured LDPC Codes

Structured low density parity check (LDPC) codes have been defined for certain systems, such as LDPC code for Wi-Fi systems operating according to the 802.11 wireless standard (e.g., 802.11an and 802.11ac systems) for example. As described above, LDPC is one example of an error coding scheme that can be used to encode information bits. LDPC codes may be designed for a fixed code rate. To increase the coding rate, code words may be punctured.

Puncturing is the act of removing bits from the code word to yield a shorter code word. Thus, punctured variable nodes correspond to code word bits (e.g., information bits or systematic bits) that are not actually transmitted. Puncturing a variable node in a LDPC code creates a shortened code (e.g. due to the removal of a bit) and, thus, an increased code rate can be achieved. For example, for a given LDPC matrix, if the base transmitted block length is $n-p$, where p is the number of punctured columns (a column corresponding to a variable node in the associated bipartite graph), n is the number of columns, and the number of base parity checks is m (e.g., corresponding to rows in the matrix and check nodes in the associated bipartite graph), then the code rate for the punctured LDPC code is $(n-m)/(n-p)$. The binary information block size is $(n-m)*Z$, where Z is the lifting, and the transmitted block size is $(n-p)*Z$.

Techniques are provided herein for puncturing structured LDPC codes that may help achieve a desired code rate. For example, techniques herein provide for puncturing highest degree variable nodes of a 5/6 code rate Wi-Fi LDPC code to produce a 7/8 code rate LDPC code. In some cases, the puncturing is performed on starting bits of the code. Aspects herein also provide designs for rate 7/8 LDPC codes with enhanced performance.

According to certain aspects, high-degree (systematic) variables nodes of a structured LDPC code can be punctured, for example, to increase the code rate. This may provide performance to capacity benefits. Puncturing a high-degree variable node can correspond to puncturing only a single column of a corresponding parity matrix—rather than puncturing random bits or multiple lower degree variable nodes.

Puncturing of a high-degree variable node (e.g., the highest degree variable node) can be done such that each check node, which is connected to a punctured variable node, is connected to only one such punctured variable node. In other words, the puncturing can be performed such that few or no check nodes are connected to multiple punctured variable nodes. For example, in a lifted LDPC code, the highest degree variable node (e.g., the variable in the LDPC code structure that is connected to the highest number of check nodes in the associated bipartite graph) can be punctured (e.g., across the permutations).

If puncturing of the highest degree variable node does not provide the desired code rate, other (e.g., additional) variable nodes can be used for puncturing such that the number of check nodes with more than two punctured variable nodes is minimized (e.g., by puncturing another highest-degree variable node or a variable node having the next highest degree of connectivity to the check nodes).

Avoiding creation of check nodes that have multiple punctured variable nodes may help to ensure that the resulting punctured LDPC code contains a low number of check nodes that are "dead" at the start of decoding. Additionally, this type of puncturing pattern can avoid the formation of small-size trapping sets (e.g., also referred to as loops) such as 4-cycles, 6-cycles, etc.). A loop (or cycle) is defined as a closed path with no repeated nodes. This implies it has an even length. A cycle in a Tanner (bipartite) graph refers to a finite set of connected edges. The edge starts and ends at the same node, and it satisfies the condition that no node (except the initial and final node) appears more than once. The length of a cycle is simply the number of edges of the cycle.

Example 7/8 LDPC Code by Puncturing 5/6 Wi-Fi Code

Figure 8:
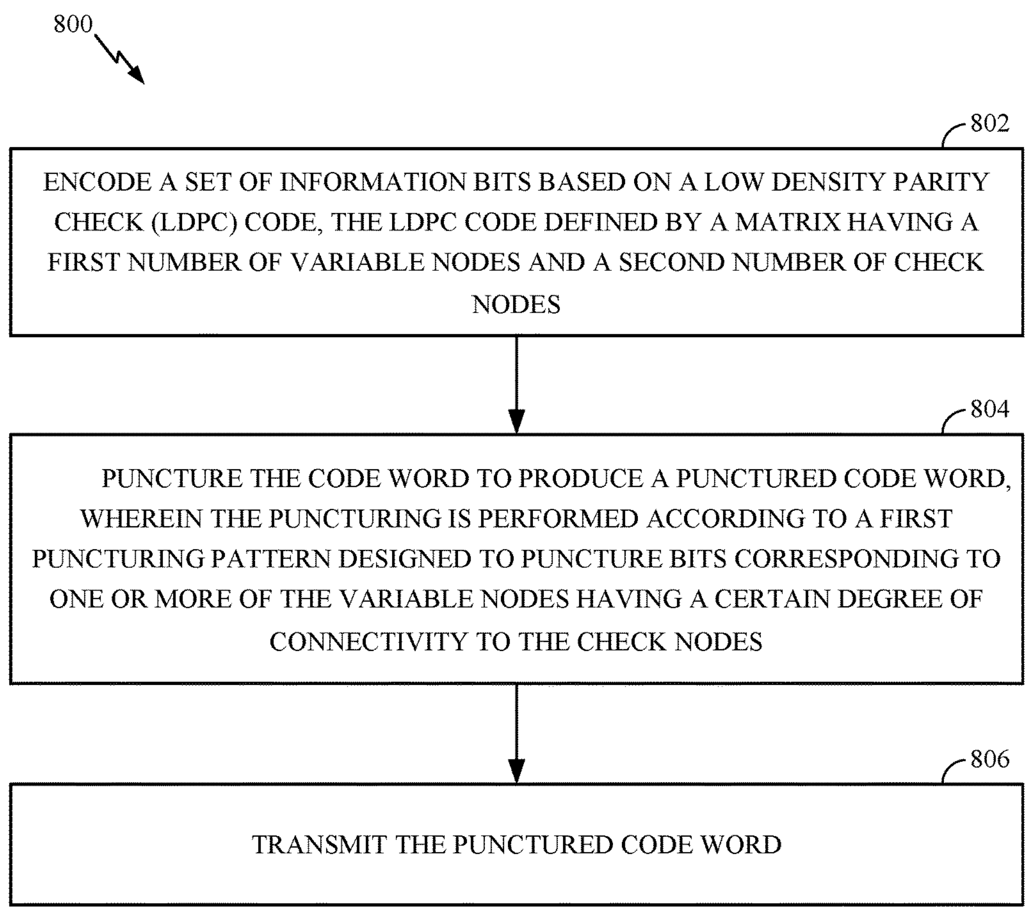
FIG. 8 is a flow diagram illustrating example operations for encoding information based on puncturing of highest degree nodes in an LDPC code structure for wireless communications by a transmitting device, in accordance with certain aspects of the present disclosure.

According to certain aspects, one way to obtain an LDPC code with enhanced performance may be based on puncturing highest degree variable nodes of a Wi-Fi LPDC code. FIG. 8 illustrates example operations 800 for wireless communication, in accordance with certain aspects of the present disclosure. Operations 800 may be performed, for example, by a transmitting device (e.g., UE 116 or BS 102). Operations 800 may begin, at 802, by encoding a set of information bits based on a LDPC code to produce a code word (e.g., rate 5/6 code word), the LDPC code defined by a matrix having a first number of variable nodes and a second number of check nodes. At 804, the transmitting device punctures the code word to produce a punctured code word, wherein the puncturing is performed according to a first puncturing pattern designed to puncture bits corresponding to one or more of the variable nodes having a certain degree of connectivity to the check nodes (e.g., to achieve a code rate of 7/8 for the punctured code word). At 806, the transmitting device transmits the punctured code word.

For example, starting from a 5/6 rate Wi-Fi LDPC code (e.g., an 802.11ac or 802.11an LDPC code), highest degree variable nodes can be punctured to produce a 7/8 rate LDPC code. According to certain aspects, this may be done by puncturing from the start of the 5/6 Wi-Fi LDPC code. In one example, the starting 93 bits of the 5/6 Wi-Fi LDPC code may be punctured (corresponding to the highest degree variable node(s)). In this case, 81 bits may be punctured from the first column of the base graph for the rate 5/6 Wi-Fi LDPC code corresponding to the highest degree variable node, and the remaining 12 bits can be punctured from the second column of the base graph. This may be done to achieve around 5% gains.

According to certain aspects, for puncturing greater than 5% (e.g., to obtain a code rate higher than 7/8), first bits can be punctured at the start (e.g., from the highest degree variable node) and the remaining bits can be punctured periodically with a fixed periodicity (e.g., 20).

According to certain aspects, other puncturing patterns can be used. For example, tail puncturing (puncturing bits at the end), periodic puncturing (e.g., puncturing from the start at a fixed periodicity), hybrid puncturing (e.g., puncturing half of the bits from the start at a fixed periodicity and puncturing the other half of the bits at the end).

Figure 9:
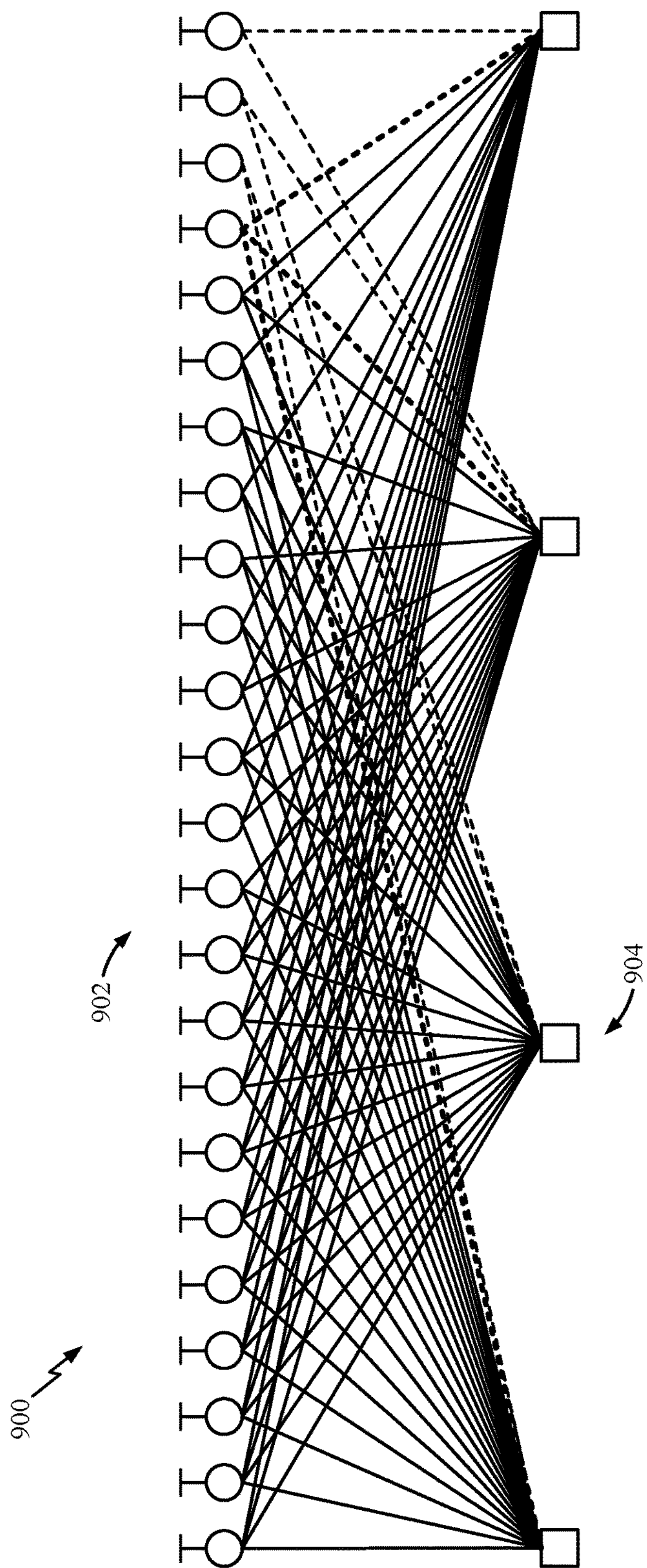
FIG. 9 shows a base graph representation of an exemplary 5/6 rate Wi-Fi LDPC code.

FIG. 9 shows a base graph representation of an exemplary 5/6 rate Wi-Fi LDPC code 900. As shown in FIG. 9, the base graph includes 24 variable nodes 902 and 4 check nodes 904. As shown, the variable nodes have various degrees of connectivity to the check nodes.

Figure 10:
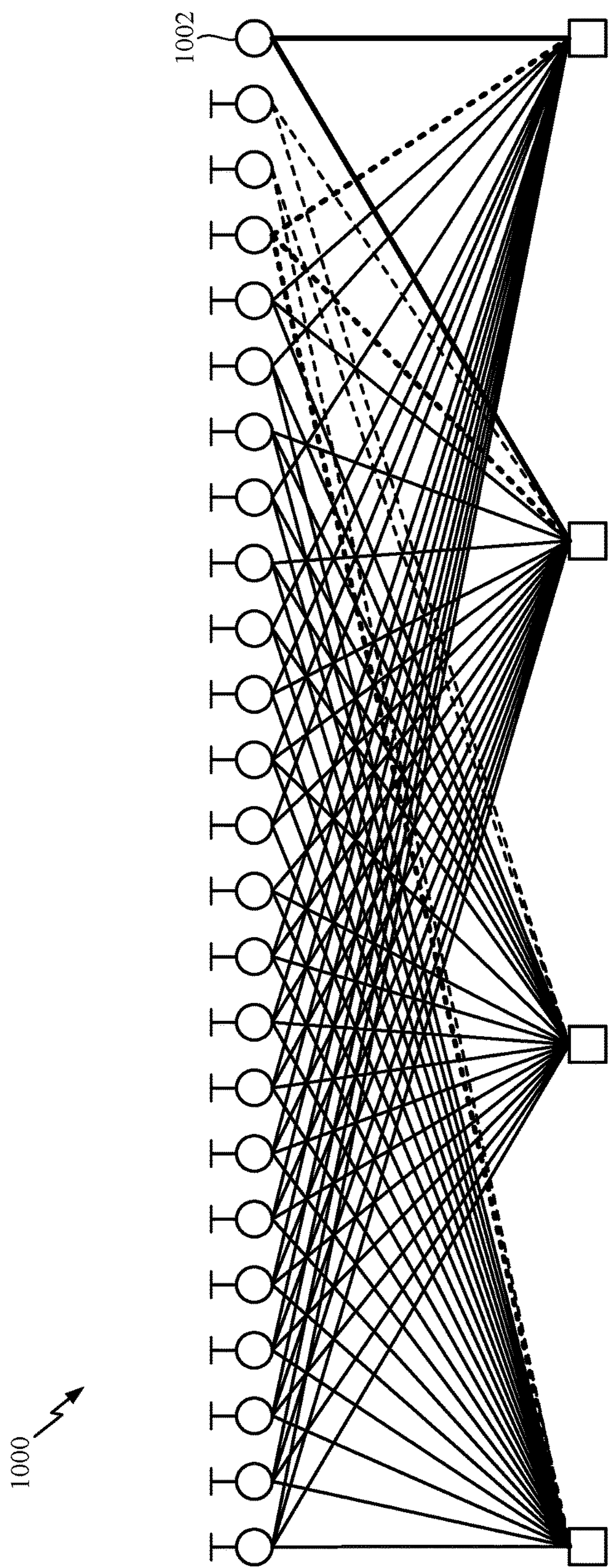
FIG. 10 shows a graphical representation of the exemplary 5/6 rate Wi-Fi LDPC code shown in FIG. 9 having a punctured low degree variable node.
Figure 11:
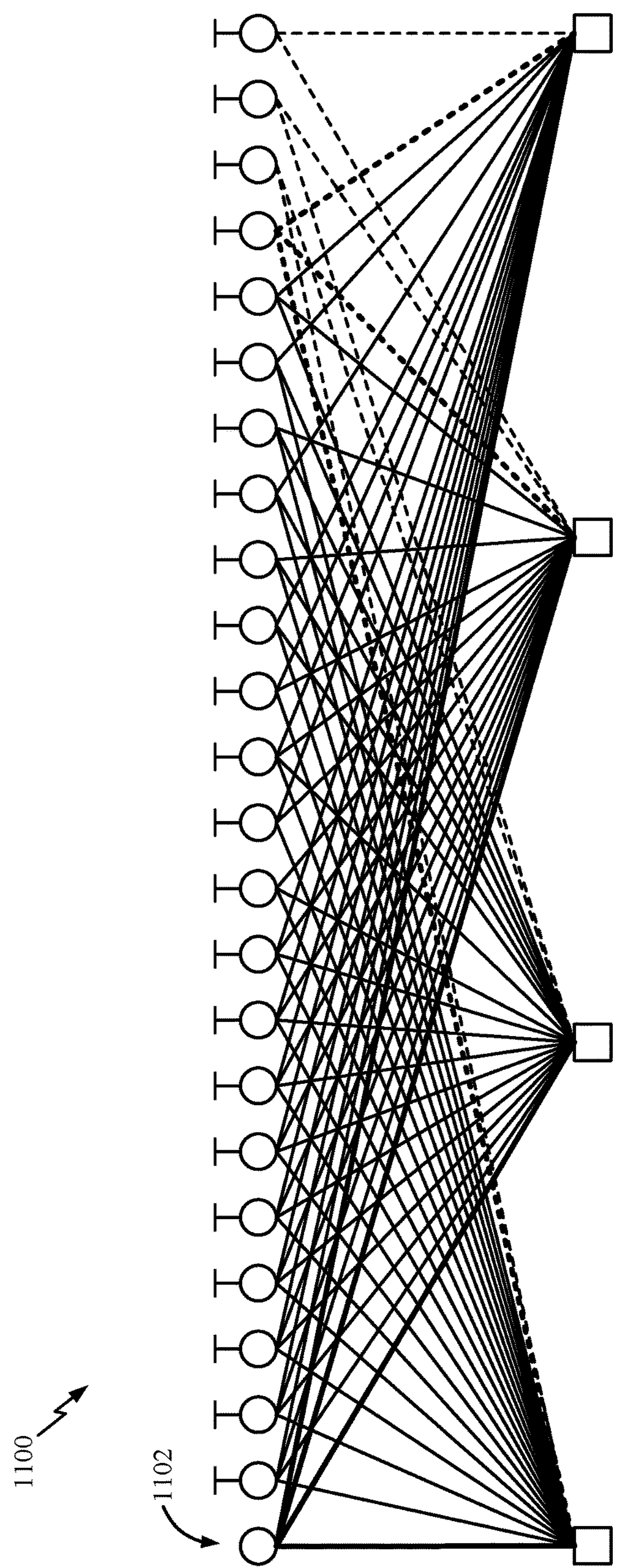
FIG. 11 shows a graphical representation of the exemplary 5/6 rate Wi-Fi LDPC code shown in FIG. 9 having a punctured highest degree variable node, in accordance with certain aspects of the present disclosure.

The rate 5/6 Wi-Fi LDPC code 900 can be lifted Z=81 as a multi-edge type structure and can have a density evolution gap (AWGN) to capacity of 0.46 dB. If a parity column is punctured (e.g., at random) for a low degree node (e.g., 2 degree node 1002 as shown in FIG. 10) for a rate 20/23 base graph the AWGN gap to capacity may be 0.49 dB. Puncturing a highest degree variable node (e.g., 4 degree 1102 as shown in FIG. 11) may provide an AWGN gap to capacity of 0.39 dB. Thus, high-degree variable node puncturing can provide a 0.1 dB improvement.

Figure 12:
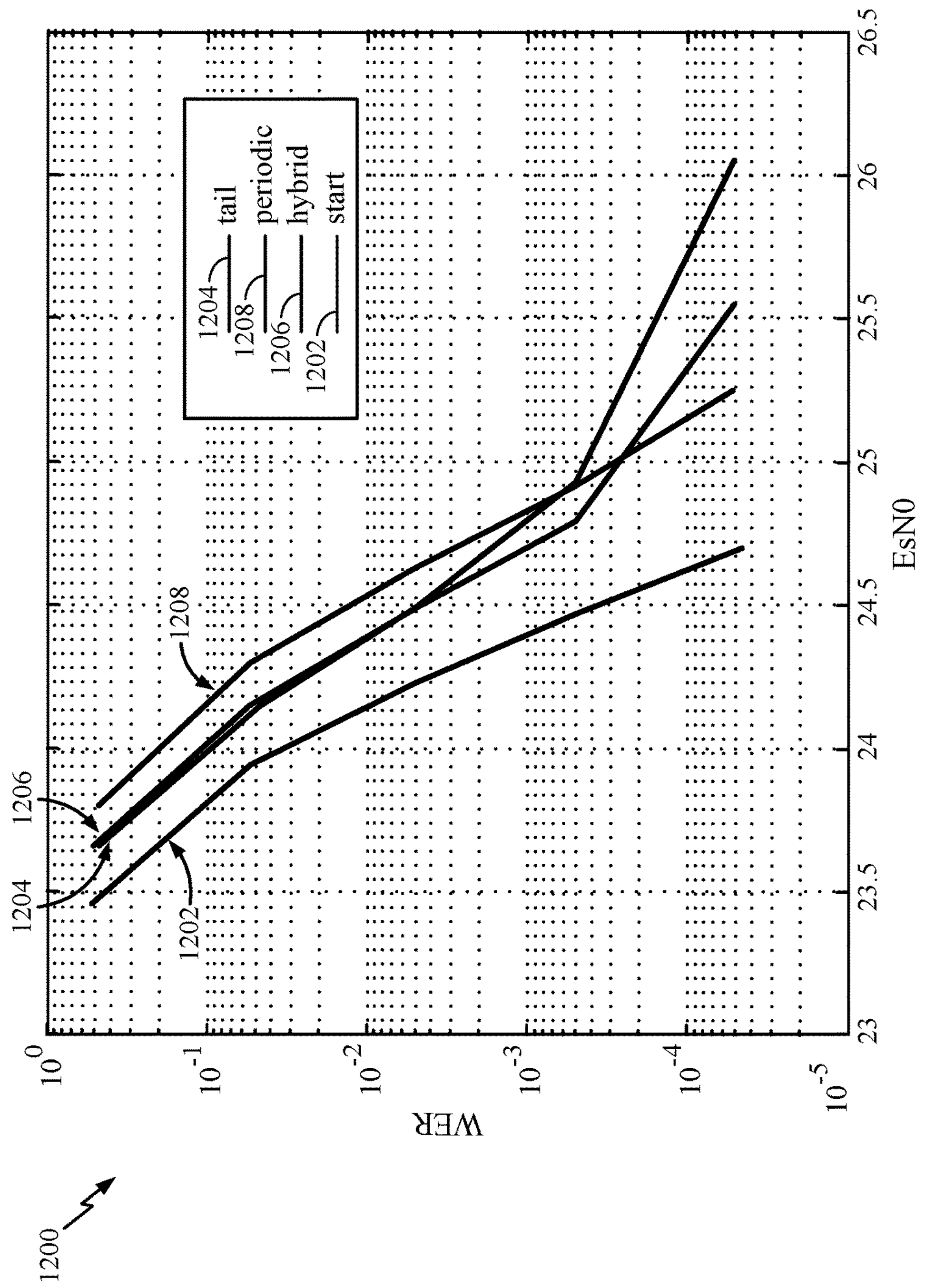
FIG. 12 is a graph showing performance of various puncturing techniques of an LDPC code at modulation and coding scheme (MCS) 9, in accordance with certain aspects of the present disclosure.
Figure 13:
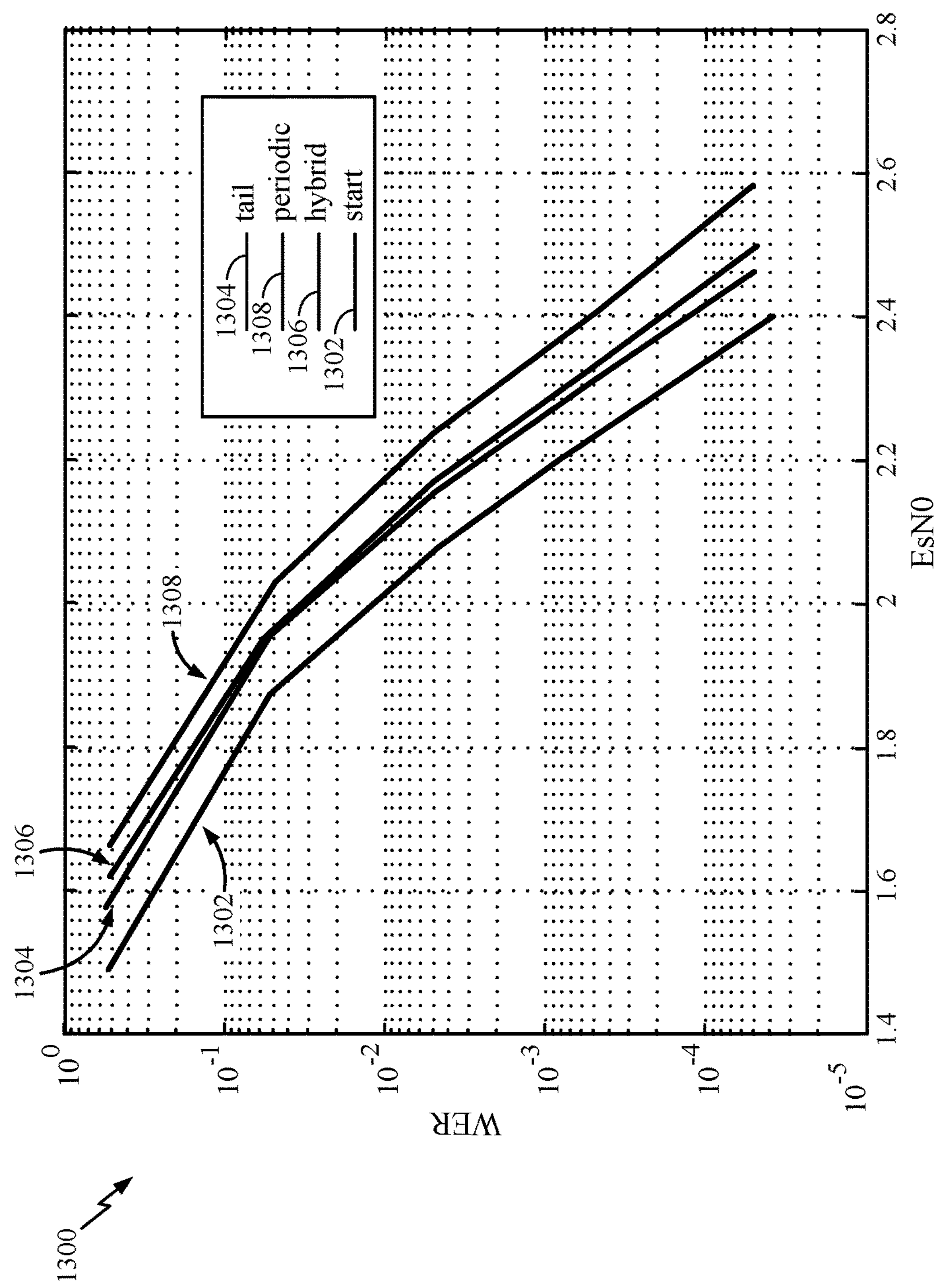
FIG. 13 is a graph showing performance of various puncturing techniques of an LDPC code at MCS 1, in accordance with certain aspects of the present disclosure.

FIG. 12 is a graph 1200 showing performance of the various puncturing techniques of an LDPC code at modulation and coding scheme (MCS) 9 with 93 punctured bits and FIG. 13 is a graph 1300 showing performance of the various puncturing techniques of an LDPC code at MCS 1 with 100 punctured bits, run 20 iterations, in accordance with certain aspects of the present disclosure. As shown in FIG. 12, for MCS 9 (e.g., 256 QAM), the curve 1202 shows performance for puncturing at the start shows better performance than the curves 1204, 1206, and 1208 for tail puncturing, hybrid puncturing, and periodic puncturing, respectively. As shown in FIG. 13, for MCS 1 (e.g., QPSK), the curve 1302 shows performance for puncturing at the start shows better performance than the curves 1304, 1306, and 1308 for periodic puncturing, hybrid puncturing, and tail puncturing, respectively.

Example Rate 7/8 LDPC Code Design

Figure 14:
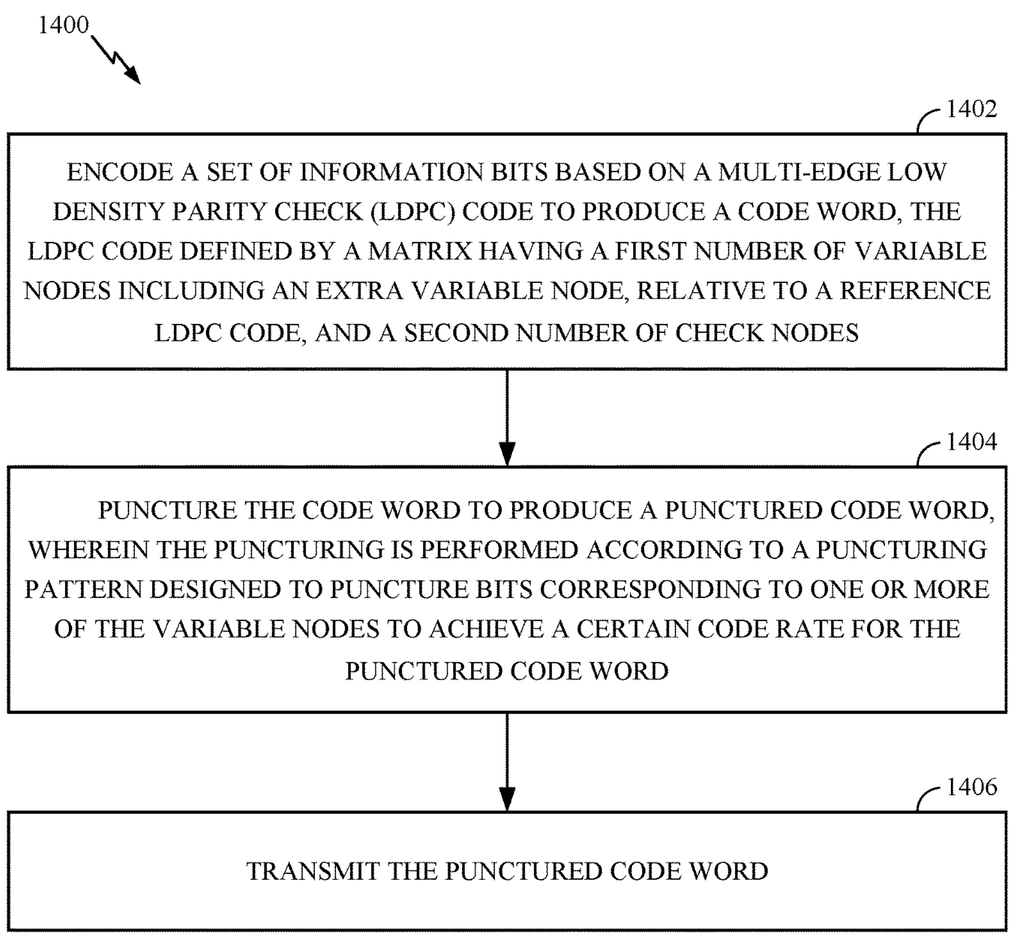
FIG. 14 is a flow diagram illustrating example operations for encoding information based on an LDPC code structure for wireless communications by a transmitting device, in accordance with certain aspects of the present disclosure.

Rate 7/8 LDPC codes obtained via puncturing of the rate 5/6 Wi-Fi LDPC code can result in reducing the code blocklength of the code. In some cases, maintaining the blocklength (e.g., 1944 bits for lift size Z=81) may be desirable. According to certain aspects, multi-edge rate 7/8 LDPC codes can be designed that are not based on puncturing of the rate 5/6 Wi-Fi code. FIG. 14 illustrates example operations 1400 for wireless communication, in accordance with certain aspects of the present disclosure. Operations 1400 may be performed, for example, by a transmitting device (e.g., UE 116 or BS 102). Operations 1400 may begin, at 1402, by encoding a set of information bits based on a multi-edge LDPC code to produce a code word, the LDPC code defined by a matrix having a first number of variable nodes including an extra variable node, relative to a reference LDPC code, and a second number of check nodes. At 1404, the transmitting device punctures the code word to produce a punctured code word, wherein the puncturing is performed according to a puncturing pattern designed to puncture bits corresponding to one or more of the variable nodes to achieve a certain code rate (e.g., a 7/8 code rate) for the punctured code word. At 1406, the transmitting device transmits the punctured code word.

Figures 15, 16:
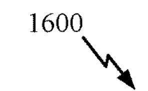
FIG. 15 is a matrix representation of an example multi-edge 7/8 rate LDPC code design, in accordance with certain aspects of the present disclosure.
FIG. 16 is a matrix representation of another example multi-edge rate 7/8 LDPC code design, in accordance with certain aspects of the present disclosure.

FIGS. 15-16 show a matrix representation of example multi-edge rate 7/8 LDPC codes that maintain a blocklength of 1944 bits for lift size Z=81, in accordance with certain aspects of the present disclosure. The rate 7/8 LDPC codes shown in FIGS. 15 and 16 have a threshold that is around 0.08 dB better than the rate 7/8 Wi-Fi LDPC code.

In the definition of standard irregular LDPC code ensembles (degree distributions), all edges in the Tanner graph representation may be statistically interchangeable. In other words, there exists a single statistical equivalence class of edges. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently.

A multi-edge type ensemble is comprised of a finite number of edge types. The degree type of a constraint node is vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint, that sockets must pair with sockets of like type, characterizes the multi-edge type concept. In a multi-edge type description, different node types can have different received distributions (e.g., the associated bits may go through different channels).

In the matrix representations shown in FIGS. 15 and 16, there are 4 edge-types and the vector d denotes the edge-type vector, the vector b=(1,0) denotes the punctured node, the vector vb,d denotes the variable node degree, the vector vb,dn denotes the number of variable nodes of that degree, the vector ud denotes the check node degree, and the vector udn denotes the number of check node of that degree.

The LDPC codes shown in FIGS. 15 and 16 introduce a high-degree punctured variable node (e.g., an extra code bit) in the base graph (e.g., for a total of 25 variable nodes in the base graph—rather than the 24 shown in FIG. 9). The additional punctured variable node is of the highest degree in both the constructions and provides a degree of freedom in constructing a better high rate (7/8) code. Thus, the number of columns in the base parity-check matrix is 25. The number of check nodes in the base matrix are 4. For lift size 81, if the high-degree variable node is punctured, the remaining nodes are 24×81=1944, therefore, maintaining the 1944 blocklength.

Example Puncturing for Retransmission

According to certain aspects, puncturing bits can be different (e.g., switched) for retransmissions. For subsequent retransmissions of information, the puncturing bits can be switched among nodes of the same or similar degree. For example, for the first transmission, 93 bits can be punctured from the start (e.g., bits [0-92]), while for the second transmission, puncturing can be performed at an offset (e.g., at an offset of 10, bits [10-112] might be punctured).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

For example, means for encoding may include one or more processors, such as the TX data processor 214, TX MIMO processor 220, and/or the processor 270 of the wireless base station 210 illustrated in FIG. 2; the TX data processor 238, Modulator 280, and/or the processor 270 of the wireless node 250 illustrated in FIG. 2; the transmitter 310, the DSP 320, and/or the processor 304 of the wireless device 302 illustrated in FIG. 3; and/or the encoder 602 of the encoder 600 illustrated in FIG. 6. Means for puncturing may comprise a processing system, which may include one or more processors, such as the TX data processor 214, TX MIMO processor 220, and/or the processor 270 of the wireless base station 210 illustrated in FIG. 2; the TX data processor 238, Modulator 280, and/or the processor 270 of the wireless node 250 illustrated in FIG. 2; the transmitter 310, the DSP 320, and/or the processor 304 of the wireless device 302 illustrated in FIG. 3; and/or the puncturing module 604 of the encoder 600 illustrated in FIG. 6. Means for transmitting comprise a transmitter, which may include the TX data processor 214, TX MIMO processor 220, the transceiver(s) *222a-222t*, and/or the antenna(s) *224a-224t* of the wireless base station 210 illustrated in FIG. 2; the TX data processor 238, the modulator 280, the transceiver(s) 252_a_-252_r_, and/or the antenna(s) 252_a_-252_r_ of the wireless node 250 illustrated in FIG. 2; the transmitter 310 and/or the antenna(s) 316 of the wireless device 302 illustrated in FIG. 3; and/or the TX chain 608 and antenna 610 of the encoder 600 illustrated in FIG. 6.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wirelessly transmitting data in accordance with a radio technology, comprising:

encoding, by encoder circuity, a set of information bits based on a low density parity check (LDPC) code to produce a code word, the LDPC code defined by a base graph having a first number of variable nodes and a second number of check nodes;

puncturing, by puncturing circuitry, bits of the code word corresponding to at least the variable node of the first number of variable nodes at a start of the code word having a highest degree of connectivity to the second number of check nodes and one or more bits at an end of the code word to produce a punctured code word; and transmitting, via transmitting circuitry, the punctured code word in accordance with the radio technology across a wireless channel.

2. The method of claim 1, further comprising puncturing, by the puncturing circuitry, remaining bits of the code word, excluding the bits corresponding to the at least one variable node at the start of the code word, with a periodicity.

3. The method of claim 1, wherein the puncturing comprises puncturing such that a number of the check nodes in the punctured code word that are connected to more than one variable node having punctured bits is minimized.

4. The method of claim 1, wherein the puncturing comprises puncturing such that a number of closed loops in the punctured code word is minimized.

5. The method of claim 1, wherein the puncturing remaining bits of the code word, excluding the one or more bits at the end of the code word, with a periodicity.

6. The method of claim 1, further comprising:

for a retransmission of the set of information bits, puncturing different bits of a code word for the set of retransmitted information bits.

7. The method of claim 6, wherein the puncturing comprises puncturing bits in the code word for the set of retransmitted information bits corresponding to different variable nodes than the at least one variable node, wherein the different variable nodes have a same degree of connectivity to check nodes as the at least one variable node.

8. The method of claim 6, wherein the puncturing comprises puncturing bits in the code word for the set of retransmitted information bits at a defined offset relative to the bits in the punctured code word.

9. The method of claim 1, wherein the LDPC code comprises an 802.11 Wi-Fi LDPC code.

10. The method of claim 1, wherein the code word is associated with a code rate of 5/6 and the punctured code word is associated with a code rate of 7/8.

11. A method for wirelessly transmitting data in accordance with a radio technology, comprising:

encoding, via encoding circuitry, a set of information bits based on a multi-edge low density parity check (LDPC) code to produce a code word, the LDPC code defined by a base graph having a first number of variable nodes including an extra variable node, relative to a 802.11 wireless local area network (WLAN) LDPC code, and a second number of check nodes;

puncturing, via puncturing circuitry, bits of the code word corresponding to one or more of the first number of variable nodes to produce a punctured code word associated with a code rate of 7/8; and transmitting, via transmitting circuitry, the punctured code word in accordance with the radio technology across a wireless channel.

12. The method of claim 11, wherein the one or more variable nodes includes the extra variable node.

13. The method of claim 11, wherein the punctured code word has a same block length as the reference 802.11 WLAN LDPC code.

14. The method of claim 11, wherein the LDPC code has a lifting value of 81 and the punctured code word has a block length of 1944 bits.

15. An apparatus for wirelessly transmitting data in accordance with a radio technology, comprising:

means for encoding a set of information bits based on a low density parity check (LDPC) code to produce a code word, the LDPC code defined by a base graph having a first number of variable nodes and a second number of check nodes;

means for puncturing bits of the code word corresponding to at least the variable node of the first number of variable nodes at a start of the code word having a highest degree of connectivity to the second number of check nodes and one or more bits at an end of the code word to produce a punctured code word; and means for transmitting the punctured code word in accordance with the radio technology across a wireless channel.

16. The apparatus of claim 15, wherein the means for puncturing is configured to puncture remaining bits of the code word, excluding the bits corresponding to the at least one variable node at the start of the code word, with a periodicity.

17. The apparatus of claim 15, wherein the means for puncturing is configured to puncture the code word such that a number of the check nodes in the punctured code word that are connected to more than one variable node having punctured bits is minimized.

18. The apparatus of claim 15, wherein the means for puncturing is configured to puncture the code word such that a number of closed loops in the punctured code word is minimized.

19. The apparatus of claim 15, wherein the means for puncturing is configured to puncture remaining bits of the code word, excluding the one or more bits at the end of the code word, with a periodicity.

20. The apparatus of claim 15, wherein the means for puncturing is further configured to:

for a retransmission of the set of information bits, puncture different bits of a code word for the set of retransmitted information bits.

21. The apparatus of claim 20, wherein the means for puncturing is configured to puncture bits in the code word for the set of retransmitted information bits corresponding to different variable nodes than the at least one variable node, wherein the different variable nodes have a same degree of connectivity to check nodes as the at least one variable node.

22. The apparatus of claim 20, wherein the means for puncturing is configured to puncture bits in the code word for the set of retransmitted information bits at a defined offset relative to the bits in the punctured code word.

23. The apparatus of claim 15, wherein the LDPC code comprises an 802.11 Wi-Fi LDPC code.

24. The apparatus of claim 15, wherein the code word is associated with a code rate of 5/6 and the punctured code word is associated with a code rate of 7/8.

25. An apparatus for wirelessly transmitting data in accordance with a radio technology, comprising:

means for encoding a set of information bits based on a multi-edge low density parity check (LDPC) code to produce a code word, the LDPC code defined by a base graph having a first number of variable nodes including an extra variable node, relative to a 802.11 wireless local area network (WLAN) LDPC code, and a second number of check nodes;

means for puncturing bits of the code word corresponding to one or more of the first number of variable nodes to produce a punctured code word associated with a code rate of 7/8; and means for transmitting the punctured code word in accordance with the radio technology across a wireless channel.

26. The apparatus of claim 25, wherein the one or more variable nodes includes the extra variable node.

27. The apparatus of claim 25, wherein the punctured code word has a same block length as the 802.11 WLAN LDPC code.

28. The apparatus of claim 25, wherein the LDPC code has a lifting value of 81 and the punctured code word has a block length of 1944 bits.

29. An apparatus for wirelessly transmitting data in accordance with a radio technology, comprising:

encoding circuitry configured to encode a set of information bits based on a low density parity check (LDPC) code to produce a code word, the LDPC code defined by a base graph having a first number of variable nodes and a second number of check nodes;

puncturing circuitry configured to puncture bits of the code word corresponding to at least the variable node of the first number of variable nodes at a start of the code word having a highest degree of connectivity to the second number of check nodes and one or more bits at an end of the code word to produce a punctured code word; and transmitting circuitry configured to transmit the punctured code word in accordance with the radio technology across a wireless channel.

30. An apparatus for wirelessly transmitting data in accordance with a radio technology, comprising:

encoding circuitry configured to encode a set of information bits based on a multi-edge low density parity check (LDPC) code to produce a code word, the LDPC code defined by a base graph having a first number of variable nodes including an extra variable node, relative to a 802.11 wireless local area network (WLAN) LDPC code, and a second number of check nodes;

puncturing circuitry configured to puncture bits of the code word corresponding to one or more of the first number of variable nodes to produce a punctured code word associated with a code rate of 7/8; and transmitting circuitry configured to transmit the punctured code word in accordance with the radio technology across a wireless channel.

31. A non-transitory computer readable medium having computer executable code stored thereon, comprising:

code for encoding a set of information bits based on a low density parity check (LDPC) code to produce a code word, the LDPC code defined by a base graph having a first number of variable nodes and a second number of check nodes;

code for puncturing bits of the code word corresponding to at least the variable node of the first number of variable nodes at a start of the code word having a highest degree of connectivity to the second number of check nodes and one or more bits at an end of the code word to produce a punctured code word; and code for transmitting the punctured code word in accordance with a radio technology across a wireless channel.

32. A non-transitory computer readable medium having computer executable code stored thereon, comprising:

code for encoding a set of information bits based on a multi-edge low density parity check (LDPC) code to produce a code word, the LDPC code defined by a base graph having a first number of variable nodes including an extra variable node, relative to a 802.11 wireless local area network (WLAN) LDPC code, and a second number of check nodes;

code for puncturing bits of the code word corresponding to one or more of the first number of variable nodes to produce a punctured code word associated with a code rate of 7/8; and code for transmitting the punctured code word in accordance with a radio technology across a wireless channel.

33. A method for wireless communication by a transmitting device, comprising:

encoding, by an encoder of a radio frequency (RF) modem, a set of information bits based on a low density parity check (LDPC) code to produce a code word, the LDPC code defined by a base graph having a first number of variable nodes and a second number of check nodes;

puncturing, by a puncturing module of the RF modem, bits of the code word corresponding to at least one of the first number of variable nodes at a start of the code word having a highest degree of connectivity to the second number of check nodes a number of bits at an end of the code word to produce a punctured code word; and transmitting, via one or more antennas of a transmitter, the punctured code word.

* * * * *